United States Patent
Dave et al.

(10) Patent No.: US 12,085,591 B2
(45) Date of Patent: Sep. 10, 2024

(54) METHOD AND APPARATUS FOR CONTACTLESS VOLTAGE AND CURRENT ESTIMATION THROUGH MEASUREMENTS OF ELECTRIC AND MAGNETIC FIELDS WITH REDUNDANT SENSOR ARRAYS

(71) Applicants: HARTING Electric GmbH & Co. KG, Espelkamp (DE); The Massachusetts Institute of Technology, Cambridge, MA (US)

(72) Inventors: Vivek R. Dave, Concord, NH (US); Felix Loske, Minden (DE); Enger Knop, Espelkamp (DE); Lutz Tröger, Osnabrück (DE); Alan E. Casallas, New York, NY (US); Jeffrey H. Lang, Sudbury, MA (US)

(73) Assignees: HARTING Electric Stiftung & Co. KG, Espelkamp (DE); The Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 18/150,032

(22) Filed: Jan. 4, 2023

(65) Prior Publication Data
US 2023/0280375 A1 Sep. 7, 2023

Related U.S. Application Data

(63) Continuation of application No. 17/112,797, filed on Dec. 4, 2020, now abandoned.
(Continued)

(51) Int. Cl.
*G01R 15/16* (2006.01)
*G01R 15/14* (2006.01)
(Continued)

(52) U.S. Cl.
CPC .......... *G01R 15/16* (2013.01); *G01R 15/142* (2013.01); *G01R 15/207* (2013.01); *G01R 21/08* (2013.01);
(Continued)

(58) Field of Classification Search
CPC ...... G01R 15/16; G01R 21/08; G01R 35/005; G01R 21/1331; G01R 33/02;
(Continued)

(56) References Cited

U.S. PATENT DOCUMENTS

| 5,473,244 A | 12/1995 | Libove et al. |
| 5,717,325 A | 2/1998 | Leeb et al. |

(Continued)

FOREIGN PATENT DOCUMENTS

WO 2017/066658 A1 4/2017

OTHER PUBLICATIONS

D'Antona et al., "Processing Magnetic Sensor Array Data for AC Current Measurement in Multiconductor Systems," IEEE Transactions on Instrumentation and Measurement, vol. 50, No. 5, Oct. 2001.
(Continued)

*Primary Examiner* — Akm Zakaria
(74) *Attorney, Agent, or Firm* — Seed IP Law Group LLP

(57) ABSTRACT

A multi-sensor, real-time, in-process current and voltage estimation system is disclosed including sensors, affiliated hardware, and data processing algorithms that allow accurate estimation of currents and voltages from magnetic and electric field measurements, respectively. Aspects of the system may be embodied in a detector that is readily attachable to conductors of an energized system for contactless current and/or voltage sensing of the conductors without requiring the conductors to be disconnected from the energized system.

20 Claims, 13 Drawing Sheets

Related U.S. Application Data

(60) Provisional application No. 62/944,239, filed on Dec. 5, 2019.

(51) Int. Cl.
  *G01R 15/20* (2006.01)
  *G01R 21/08* (2006.01)
  *G01R 21/133* (2006.01)
  *G01R 33/00* (2006.01)
  *G01R 33/02* (2006.01)
  *G01R 33/06* (2006.01)
  *G01R 35/00* (2006.01)

(52) U.S. Cl.
  CPC ..... *G01R 21/1331* (2013.01); *G01R 33/0029* (2013.01); *G01R 33/0082* (2013.01); *G01R 33/0094* (2013.01); *G01R 33/02* (2013.01); *G01R 33/06* (2013.01); *G01R 35/005* (2013.01)

(58) Field of Classification Search
  CPC ............ G01R 33/0082; G01R 33/0029; G01R 33/0094; G01R 15/20; G01R 33/06
  See application file for complete search history.

(56) References Cited

U.S. PATENT DOCUMENTS

| | | | |
|---|---|---|---|
| 8,907,664 B2 | 12/2014 | Leeb et al. | |
| 8,930,152 B2 * | 1/2015 | Patel | G01R 15/207 702/62 |
| 9,678,115 B2 * | 6/2017 | Raghunathan | G01R 19/0084 |
| 9,759,798 B2 | 9/2017 | Kolwalkar et al. | |
| 9,945,692 B2 | 4/2018 | Leeb et al. | |
| 11,002,765 B1 * | 5/2021 | Lorek | G01R 15/16 |
| 2017/0184635 A1 | 6/2017 | Ugge et al. | |
| 2019/0025348 A1 * | 1/2019 | Slivnik | G01R 21/00 |
| 2019/0293689 A1 | 9/2019 | Lerner et al. | |

OTHER PUBLICATIONS

Di Rienzo et al. "Spatial Harmonic Expansion for Use with Magnetic Sensor Arrays," IEEE Transactions on Magnetics, vol. 46, No. 1, Jan. 2010, 6 pages.

Donnal, John, "Home NILM: A Comprehensive Energy Monitoring Toolkit," Masters of Science Thesis in Electrical Engineering and Computer Science, Massachusetts Institute of Technology, 2013, 196 pages.

Paris, James, "A Comprehensive System for Non-Intrusive Load Monitoring and Diagnostics," Doctor of Philosophy Thesis in Electrical Engineering and Computer Science, Massachusetts Institute of Technology, 2013, 612 pages.

Lawrence et al., "Non-contact Measurement of Line Voltage," IEEE Sensors Journal, vol. 16, Issue: 24, Dec. 15, 2016, 8 pages.

Yu et al., "Circular Array of Magnetic Sensors for Current Measurement: Analysis for Error Caused by Position of Conductor," Sensors, 18, 578; 2018, 12 pages.

* cited by examiner

METHOD AND APPARATUS FOR CONTACTLESS VOLTAGE AND CURRENT ESTIMATION THROUGH MEASUREMENTS OF ELECTRIC AND MAGNETIC FIELDS WITH REDUNDANT SENSOR ARRAYS

CROSS-REFERENCE TO RELATED APPLICATIONS

This application is a continuation of U.S. patent application Ser. No. 17/112,797, filed Dec. 4, 2020, which claims the benefit under 35 U.S.C. § 119(e) of U.S. Provisional Patent Application No. 62/944,239, filed Dec. 5, 2019, the entire disclosure of which is herein incorporated by reference for all purposes.

BACKGROUND

Technical Field

This disclosure relates to the field of measurements of current and voltage in real-time and in-process on various physical assets or while various processes utilizing energized electrical equipment are underway. Furthermore, these measurements are made by direct measurement of electric and magnetic fields and estimation of voltages and currents, respectively. Such systems and methods may be part of a monitoring and/or control system for a wide range of processes, machines, and other physical assets or systems involving the use of energized electrical equipment.

Description of the Related Art

The present disclosure relates to the estimation of currents and voltages from magnetic and electric fields. There are previous approaches and techniques used with attendant benefits but also with various shortcomings. Some previous efforts are described in the following references, each of which is incorporated herein by reference in its entirety.

Donnal, John, "Home NILM: A Comprehensive Energy Monitoring Toolkit," Masters of Science Thesis in Electrical Engineering and Computer Science, Massachusetts Institute of Technology, 2013.

Paris, James, "A Comprehensive System for Non-Intrusive Load Monitoring and Diagnostics," Doctor of Philosophy Thesis in Electrical Engineering and Computer Science, Massachusetts Institute of Technology, 2013.

D'Antona, Gabriele, Di Rienzo, Luca, Ottoboni, Roberto, Manara, Angelo, "Processing Magnetic Sensor Array Data for AC Current Measurement in Multiconductor Systems," IEEE Transactions On Instrumentation And Measurement, Vol. 50, No. 5, October 2001.

Yu, Hao, Qian, Zheng, Liu, Huayi and Qu, Jiaqi, "Circular Array of Magnetic Sensors for Current Measurement: Analysis for Error Caused by Position of Conductor," Sensors, 18, 578; 2018

Steven B. Leeb, Steven, Clifford, Zachary, Cooley, John, and Avestruz, Al-Thaddeus, "Non-Intrusive Monitoring of Power and Other Parameters," U.S. Pat. No. 8,907,664, 2014.

Leeb, Steven, Paris, James, Donnal, John Moon, Jinyeong, Schantz, Christopher, "Non-Intrusive Monitoring," U.S. Pat. No. 9,945,692, 2018.

Leeb, Steven, Khan, Umair, Shaw, Steven, "Multiprocessing Transent Event Detector for Use in a Nonintrusive Electrical Load Monitoring System," U.S. Pat. No. 5,717,325, 1998.

John Sebastian Donnal, John, Paris, James, Leeb, Steven, Lawrence, David, "Non-Intrusive Load Monitoring," US PCT Patent Application PCT/US16/57165, filed October 2016.

L. Di Rienzo and Z. Zhang, "Spatial Harmonic Expansion for Use with Magnetic Sensor Arrays," Thesis, Politecnico di Milano 01, 2010.

John Donnal David Lawrence and Steven Leeb. Non-contact Measurement of Line Voltage, IEEE Sensors Journal, Volume: 16, Issue: 24, Dec. 15, 2016.

BRIEF SUMMARY

Electrically energized systems and equipment are ubiquitous and are found in many applications such as manufacturing processes, industrial processes, chemical processes, biomedical and pharmaceutical processes, oil and gas exploration and recovery processes, commercial and residential buildings, manufacturing or industrial plants, machines, vehicles, rail systems and components, and many other physical assets or processes not specifically enumerated herein could benefit from accurate measurement of current and voltage. In some cases, the current and voltage measurement systems, methods and apparatus are built into the aforementioned equipment or processes right at the time of original equipment manufacture (OEM). This is certainly an easier time to incorporate such measurements as opposed to retrofit of processes or equipment at a later point in time in the field. However, there are many such "brownfield" applications, i.e., applications where the original equipment or process did not include such current and voltage measurements, but for various reasons it is desirable to put such measurements in place at a later point in time.

Monitoring cable currents and voltages is a critical task in many commercial and industrial environments, since it can be used to examine the quality and use of electrical power, and track machine health and process performance. However, installing equipment to make contact measurements of current and voltage can be time-consuming and require a lengthy shut down of equipment. For this reason, embodiments of the present invention relate to contactless voltage and current sensing systems or "detectors" that can be positioned around a set of cables to estimate the current and voltage waveforms within those cables. These estimates may be processed by a computing system (either onboard the detector or communicatively coupled thereto), which can perform further digital analysis using the processed waveforms and potentially transmit the data to other computers or devices in a network.

There are many reasons why such measurements could be useful. For example, such measurements can be useful in the monitoring of a system, a piece of equipment or a process. The purpose of such monitoring can include the following.

1. Power Usage. First, a basic understanding of local power consumption is useful from an energy efficiency point of view. Various energy conservation and efficiency programs such as the US Department of Energy EnergyStar Certification and the ISO 50001 Energy Management system are possible to implement only if there is a detailed and localized understanding of power consumption at the discrete machine and process level.

2. Power Quality. Second, it is useful to investigate the time-based transient behavior of electrical power coming into a process, plant, or specific piece of equipment. Such transients can cause unplanned machine downtime. Waveform shape, missed cycles, higher order harmonics, real power, apparent power, and total harmonic distortion are examples of metrics of figures of merit that could be derived from such real-time monitoring of power quality.

3. Machine Health. In an electromechanical system, electrochemical system, or any other system or process that uses electrical power to accomplish specific functions or tasks, there must necessarily exist a link between the physics of the task or function and the electrical energy used to power it. In other words, transient behaviors in one should manifest in the other. This is generally the principle behind non-intrusive load monitoring (NILM) for example, which can make inferences on the state of health of a load based on a careful examination of the electrical transients. For machine health monitoring, electrical signatures and transients can be linked to nominal and off-nominal operating states of the machine, thereby allowing predictive health monitoring and enabling predictive maintenance based on the characteristics or features of such in-process electrical measurements.

4. Process Quality. Even further extending the principles elucidated in the preceding points, it is possible to use electrical measurements of current and voltage, in combination with other sensor data, to make inferences on the quality of the process or the quality of the output product from a process or system involving energized electrical equipment. The essential premise here again is that in-process signatures from electrical and other signal sources can be used to establish a baseline of process or machine performance which is capable of producing acceptable parts or products. Conversely deviations from the baseline levels could indicate that the process or equipment has encountered a fault condition and the quality of the part or other product(s) being produced could be compromised. This in-process signature of quality provides an earlier detection of potentially off-nominal product or parts before the final inspection stage, where it is often too late to take corrective actions.

Embodiments of the systems and methods disclosed herein provide contactless voltage estimation and/or contactless current estimation through measurements of electric and magnetic fields, respectively, using redundant sensor arrays and subsequent data processing of said measurements.

Embodiments of the invention may be summarized as providing a contactless voltage and current estimation system. More particularly, embodiments may be summarized as providing a multi-sensor, real-time, in-process current and voltage estimation system including sensors, affiliated hardware, and data processing algorithms that allow accurate estimation of currents and voltages from magnetic and electric field measurements, respectively. Other embodiments of the invention may be summarized as providing a multi-sensor, redundant measurement method which allows rejection of electromagnetic noise or disturbances not associated with the primary currents and voltages being measured. Embodiments of the invention further relate to a contactless sensor developed to estimate the line currents and line-to-line voltages of a multi-phase cable in the presence of significant external disturbances. The current estimates are derived from an array of point magnetic field measurements which may be processed by a linear least-square-error estimator, or other estimators. The gains in the estimator may be chosen using a probabilistic model of measurement errors created by external magnetic field sources. Embodiments of the invention further relate to a contactless, multi-sensor method of voltage estimation in which the voltage estimates are derived using actively-guarded electrodes that capacitively couple to the cable conductors. Methods involving capacitively coupling signals onto the cables are also proposed and demonstrated to determine the coupling capacitance without operator intervention. In accordance with some particularly advantageous embodiments, contactless current and voltage estimation may be provided in which the accuracy as a percentage of full scale is less than 1%. Additionally, embodiments of the measurement systems disclosed herein may be used as part of an open or closed loop control system for processes, machines, or other physical assets that utilize electric energy or energized equipment and for which such measurements can provide feedback signals. Furthermore, in-process measurements can be used as part of a monitoring and alerting system to define a feasible process space within which the processes, machines, or other physical assets utilizing energized electrical equipment being monitored are deemed to be in a nominal or conversely an off-nominal state.

BRIEF DESCRIPTION OF THE SEVERAL VIEWS OF THE DRAWINGS

Embodiments of the invention and many of the attendant advantages will become more readily appreciated as the same become better understood by reference to the following detailed description, when taken in conjunction with the accompanying drawings.

The patent or application file contains at least one drawing executed in color. Copies of this patent or patent application publication with color drawing(s) will be provided by the Office upon request and payment of the necessary fee.

DETAILED DESCRIPTION

As previously mentioned, "brownfield" applications are best instrumented by noncontact measurement techniques where there is no ohmic contact between the measurement device and the energized electrical system being measured. Additionally, there is a desire for a robust mechanism for noise rejection where the noise can come from a variety of electromagnetic sources. Examples of such sources of noise include, but are not limited to: electric and magnetic fields from nearby conductors other than those being directly interrogated; eddy currents; magnetic fields caused by permanent magnets; the background noise caused by the presence of a large number of electrical systems all at 60 Hz (or 50 Hz in most part of the world), and other noise sources.

Figure 1:
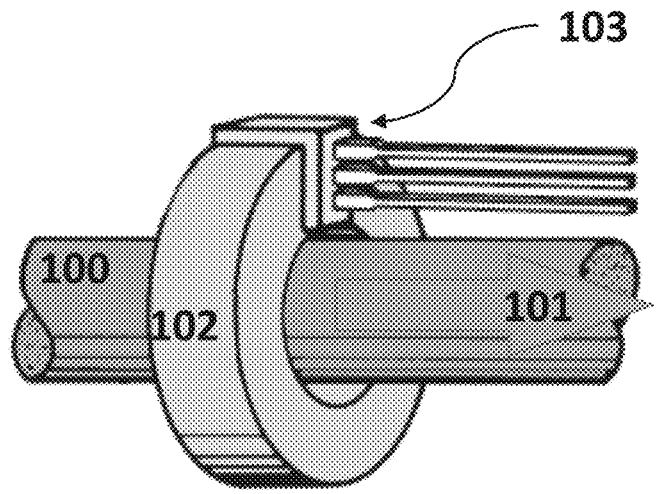
FIG. 1 is a perspective view of a conventional current sensor.

For a conventional current sensor, isolation of other magnetic fields is generally accomplished through some magnetic coupling element such as a toroidal core made of ferrous materials. This is shown in FIG. 1. The conductor of interest 100 has current 101 flowing through it. The toroidal core 102 isolates and concentrates the magnetic field produced by the conductor 100 and precludes any other external magnetic field from being measured. The magnetic sensor 103 is inserted into a small slot in the toroid 102. In this way, the sensor is tightly coupled to the toroid and is able to reject other external sources of disturbance such as other magnetic fields in the vicinity. The problem with such measurements is that in many cases, the toroidal elements are monolithic and cannot be split easily. This means that the conductor 100 has to be disconnected temporarily from the energized system so that the sensor could be placed. It is therefore an object of embodiments of the present invention to provide a non-contact system that is very convenient to install and does not require disassembly of the electrical system being monitored.

Figure 2:
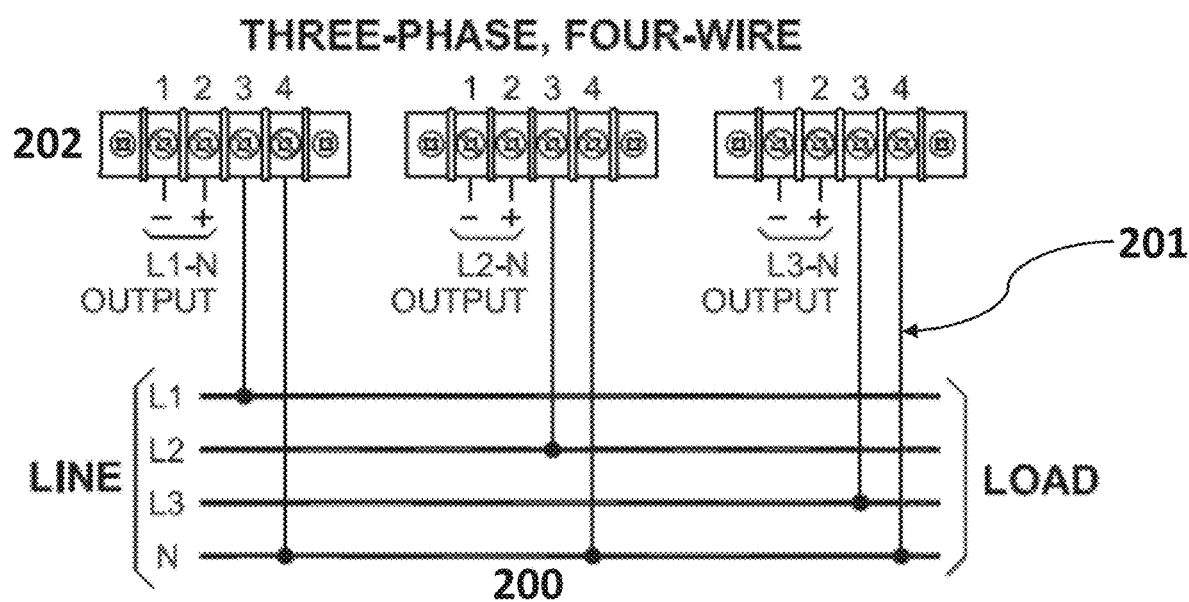
FIG. 2 is a schematic representation of a conventional voltage sensing arrangement.

Similarly in precision voltage sensing, often the type of transducer used in industrial practice requires a more intrusive measurement and even involves ohmic contact with the energized circuit in many cases. This is schematically shown in FIG. 2. In this case, a three phase AC system is shown with four conductors—the three phases plus a neutral wire. These line and load wires 200 are physically connected by probe wires 201 to terminal blocks 202 where the voltage differences between various pairs of wires are measured. An output signal, typically a DC voltage or current, which is proportional to the input AC voltage, is then provided as the sensor reading also from the terminal blocks 202. The installation of such a sensor involves disconnection and/or disassembly of the energized electrical system, installation of probe wires, and the resulting ohmic contact between the transducer and the system being measured.

Embodiments of the present invention eliminate limitations of the aforementioned sensors and provide a contactless detector system that can be easily and conveniently installed in the field of use.

Current Estimation from Magnetic Field Measurements

Figure 3:
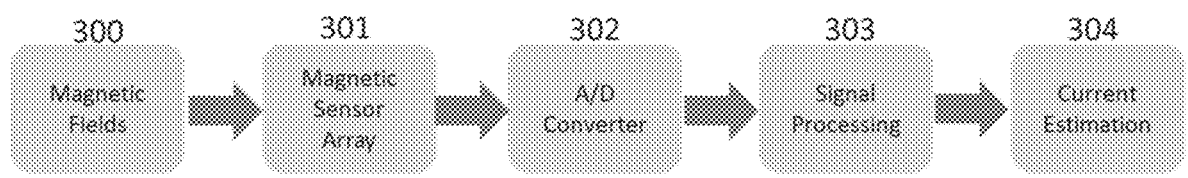
FIG. 3 is a process flow diagram for generating contactless current estimates.
Figure 4:
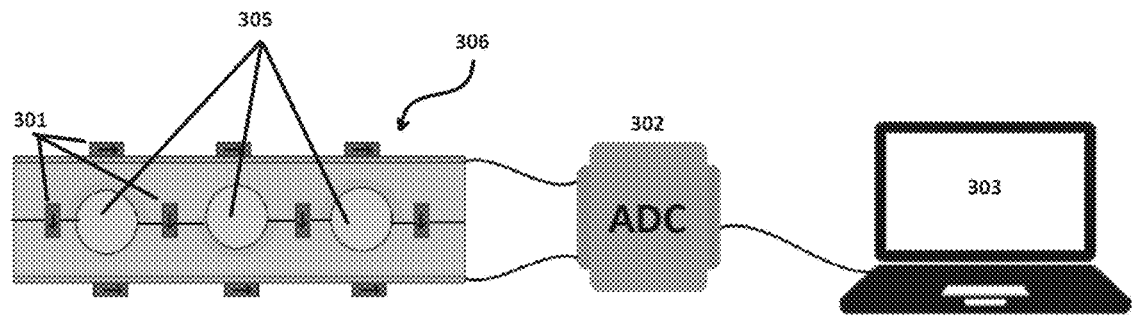
FIG. 4 is a schematic representation of a detector system for making contactless current measurements according to the process illustrated in FIG. 3.

The overall process for making contactless current measurements described herein is outlined in FIG. 3 and a schematic representation of an associated detector system is shown in FIG. 4. The magnetic fields 300 generated by cables 305 within an energized electrical detector 306 are measured using an array of magnetic sensors 301. These sensors 301 can be a variety of devices including Hall effect sensors, fluxgate sensors, tunneling magnetoresistive sensors, etc. Generally, the sensors 301 are solid state electronic devices that are based on an underlying device physics principle (i.e. the Hall Effect) that produces a voltage proportional or in some functional relationship to the magnitude of the magnetic field sensed. The sensors 301 generally will produce an analog voltage output, which is then converted to a digital signal by an analog to digital converters (A/D Converter, ADC) 302. Next, signal processing 303 is performed to provide noise rejection and accurate estimation of the current from the magnetic field data. Finally, the current estimation 304 is produced. This information may then be transmitted onwards to a monitoring system, data logger, control system, edge computing device, cloud computing, or some other data storage and processing system.

Generally, such contactless current estimation is performed by measuring the magnetic fields produced by a current. According to Ampere's Law, an infinite current-carrying cable will produce a circular magnetic field where the magnitude |B| at a certain point in space is:

$$|B| = \frac{\mu_0 I}{2\pi r}$$

where r is the distance between the point in space and the center of the cable, I is the current magnitude, and $\mu_0$ is the permeability of free space. The magnetic field will have a direction perpendicular to the vector formed from the center of the cable to the point being measured.

To measure magnetic fields, an array of magnetic field sensors are supported in a fixed relationship with respect to one or more current carrying cables to sense a magnetic field in a vicinity of the cables during operation. Each magnetic field sensor may be, for example, a fluxgate sensor which outputs a voltage linearly proportional to the component of the magnetic field along the axis of sensitivity of the sensor. Texas Instruments' DRV425 chip is one example of such a magnetic field sensor. The output voltage Vout of this sensor is given by:

$$V_{Out}(V) = 48.8 \frac{mA}{mT} * R_{Shunt}(\Omega) * B(mT) + V_{Offset}(V)$$

where Rshunt is the value of a shunt resistor and Voffset is the voltage output by the sensor when no magnetic field is detected. Note that the sensor measures the component of the magnetic field along its axis of sensitivity, so if there exists an angle Θ between the magnetic field vector B and the sensor orientation, the sensor will detect the quantity (Θ). In evaluating specific implementations of embodiments of the invention, the DRV425 magnetic field sensor was utilized at 5 V and hardware pins were selected to set Voffset to 2.5 V regardless of the power voltage level.

For purposes of the present disclosure, an implementation utilizing ten fluxgate sensors will be described; however, it is appreciated that embodiments of the invention may be practiced with more or fewer sensors and/or with different types of magnetic field sensors.

As previously indicated, the magnetic field vector produced by a current will have the magnitude:

$$|B| = \frac{u_0 I}{2\pi r}$$

and will have a direction perpendicular to a vector from the center of a cable to the point at which the measurement is taken. Since the DRV425 of the aforementioned implementation of an example embodiment of the invention only detects the component of a magnetic field along its axis of sensitivity, the magnetic field it will detect will be a scalar with the value:

$$B = \frac{\cos(\theta_{i,j}) u_0 I}{2\pi r_{i,j}}$$

Where $r_i$ is the distance between current i and sensor j, and $\theta_{i,j}$ is the angle between the axis of sensitivity of sensor j and a vector extending from cable i to sensor j. In the case of a three-phase system where there are three current-carrying wires, the magnetic field (t) detected by each sensor can be represented as a function of the currents of the three cables as given by:

$$B_i(t) = \frac{\cos(\theta_{i,0}) u_0 I_0(t)}{2\pi r_{i,0}} + \frac{\cos(\theta_{i,1}) u_0 I_1(t)}{2\pi r_{i,1}} + \frac{\cos(\theta_{i,2}) u_0 I_2(t)}{2\pi r_{i,2}}$$

Estimation algorithms of embodiments of the present invention assume the cables (also referred to herein as conductors or current carrying conductors) and magnetic field sensors are stationary with respect to each other. Thus, the location terms $\theta_{i,j}$ and $r_{i,j}$ as well as all other constants, can be represented as a single constant for each current, and the expression simplifies to:

$$B_i(t) = \alpha_{i,0} I_0(t) + \alpha_{i,1} I_1(t) + \alpha_{i,2} I_2(t)$$

where the constants are in the form $a_{i,j}$. Since the sensors are stationary with respect to the currents, the equation describing their relationship becomes linear. Furthermore, with N sensors, we have a set of N equations that can be used to solve for the 3 unknown currents. These N equations can be expressed in the matrix form AI=b, where the matrix A is an N×3 matrix. Since there are more sensors than the number of currents being estimated in accordance with embodiments of the present invention, it is possible to use the redundant measurements to reject noise and disturbances, as described in more detail elsewhere.

In accordance with embodiments described herein, the detector systems do not include hardware shielding around the magnetic field sensor array, and instead perform all necessary filtering with software processing. Accordingly, several types of external magnetic fields will also be detected by the sensor array and affect the accuracy of current estimates. The most important and common external magnetic fields are discussed below.

Earth's Magnetic Field. The magnetic field generated by the Earth may be treated as a spatially uniform and temporally constant field. As such, a set of magnetic field sensors with the same axis of sensitivity will detect the same value from Earth's magnetic field, regardless of the field's orientation. For example, if the axes of sensitivity of some sensors are pointing to the right, they will all detect the same value, ux. A set of magnetic field sensors with the opposite axis of sensitivity would detect the value −ux. A perpendicular set of sensors would detect a completely different value uy, which cannot be determined from ux without knowing Earth's magnetic field beforehand. This model was taken into account by the estimators described herein.

Ambient Fields. Generally, the magnetic field sensors will detect ambient magnetic fields originating from the building power infrastructure. In the US these fields exist at 60 Hz, while in other countries, such as Japan, they will exist at 50 Hz. Since the origins of these fields are very far away, they are effectively spatially uniform when detected by the sensor array. Thus, these fields may be modelled as a time-varying but spatially uniform field.

Although the presence of such ambient fields is known, frequency filtering is not used in accordance with embodiments of the present invention to separate these fields from the currents to be detected because the currents themselves will typically be running at the same frequency. Instead, estimation algorithms of embodiments of the present invention focus on the spatial properties of the internal and external currents for spatial filtering and it is for this reason that a redundant sensor array with sensors at different locations is used to collect readings and perform estimation.

In view of the above, spatially uniform magnetic field terms are introduced into the equation modelling the fields detected by each sensor as a pair of perpendicular uniform terms, (t) and (t):

$$B_i(t) = \alpha_{i,0} I_0(t) + \alpha_{i,1} I_1(t) + \alpha_{i,2} I_2(t) + u_x(t) + u_y(t)$$

Now, if the case of external wires as an interfering ambient field is considered, then the magnetic field detected by an environment that includes P external wires is given by:

$$B_i(t) = \sum_{j=0}^{3} \alpha_{ij} I_j(t) + u_x(t) + u_y(t) + \sum_{k=0}^{P} \frac{\cos(\theta_{i,k}) u_0 I_k(t)}{2\pi r_{i,k}}$$

In the case of an external conductor, such as a plate, that is causing a disturbing ambient field, a magnetic field in the primary cables to be measured will induce an eddy current in the conductor plate, which will in turn produce its own magnetic field. It is understood that if a current-carrying cable induces a current in a nearby thin perfectly conducting plate, the induced magnetic field will be equivalent to the magnetic field produced if instead there was a conductor on the opposite side of plate. If the plate is not perfectly conducting, the equivalent current will have a different phase and magnitude than the cable current. Thus, the magnetic field created by an eddy current in a metallic plate running parallel to the cables to be measured can be modeled as a parallel wire and the model used in the case of external wires set forth above is still valid for this case.

Estimation algorithms of embodiments of the present invention depend on knowing the gains between each current and the detected magnetic field, expressed as $\alpha_i$. These gains are the terms of the matrix A when expressing the relationship between the current vector I and the magnetic field vector b as the matrix equation AI=b.

With these model equations, it is possible both make a theoretical prediction as to the values of the gain matrix for a specific instance, as well as to make experimental measurements, and hence to compare these two.

For example consider the case of the ten sensors used in specific implementations of embodiments of the present invention described herein.

To calculate the matrix A using hardware, a range of DC currents may be applied through each cable, one cable at a time. The magnetic fields detected are a linear function of the current being applied. The slope of the linear function detected by sensor j when a range of currents was applied to cable i is the i, j-th term of the matrix A.

According to aspects of the present invention, the optimal placement of magnetic field sensors to minimize current error was investigated. Since the magnetic fields created by the internal and external cables is the superposition of the fields created by the cables individually, and since most of the current estimation methods tested were linear, the estimation error can be expressed as the result of applying the magnetic fields from the external cables through the estimator. For example, the error between the true current I and the current estimate $\hat{I}$ formed by the Ordinary Least Squares estimator is:

$$I - \hat{I} = (A^T A)^{-1} A^T b_{internal} - (A^T A)^{-1} A^T b_{total}$$

where $b_{internal}$ is the vector of magnetic fields created by the internal currents and $b_{external}$ is the vector of magnetic fields created by external sources. The detected field $b_{total}$ is the sum of the fields from the internal and external cables, so $$I - \hat{I} = (A^T A)^{-1} b_{internal} - (A^T A)^{-1} A^T (b_{internal} + b_{external})$$
$$= (A^T A)^{-1} A^T b_{external}$$

While the location of external cables are not known beforehand, an object underlying embodiments of the present invention was to find the position of the sensors with the smallest worst case error, or, in other words, a sensor placement configuration that performed the best under the most adversarial placement of a single external cable. This optimization problem can be represented as $$\min_{(x_0,y_0), \ldots, (x_N,y_N)} \max_{(x_e,y_e)} \text{sum}(|(A^T A)^{-1} A^T b_{external}||)$$

where the location of the external wire is given as $(x_e, y_e)$ and the locations of the sensors are given by $(x_0, y_0), \ldots, (x_N, y_N)$.

The absolute value of $(A^T A)^{-1} A^T b_{external}$ is summed because this expression is a vector of three currents. Note that the terms in the matrix A will involve the sensor location variables $(x_0, y_0), \ldots, (x_N, y_N)$ and the terms in the magnetic field vector will involve those variables as well as the external cable location variables $(x_e, y_e)$.

Figure 5:
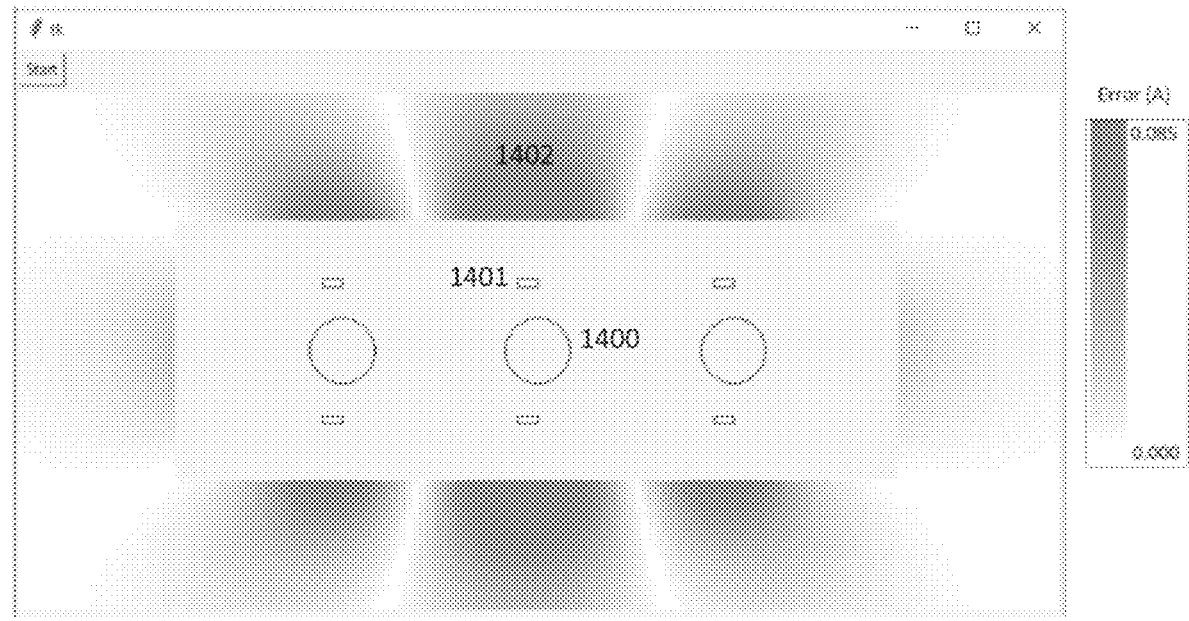
FIGS. 5-7 provide error maps associated with an array of six, ten and thirty-six magnetic field sensors, respectively, according to example embodiments of a current sensing detector comprising said sensors.
Figure 6:
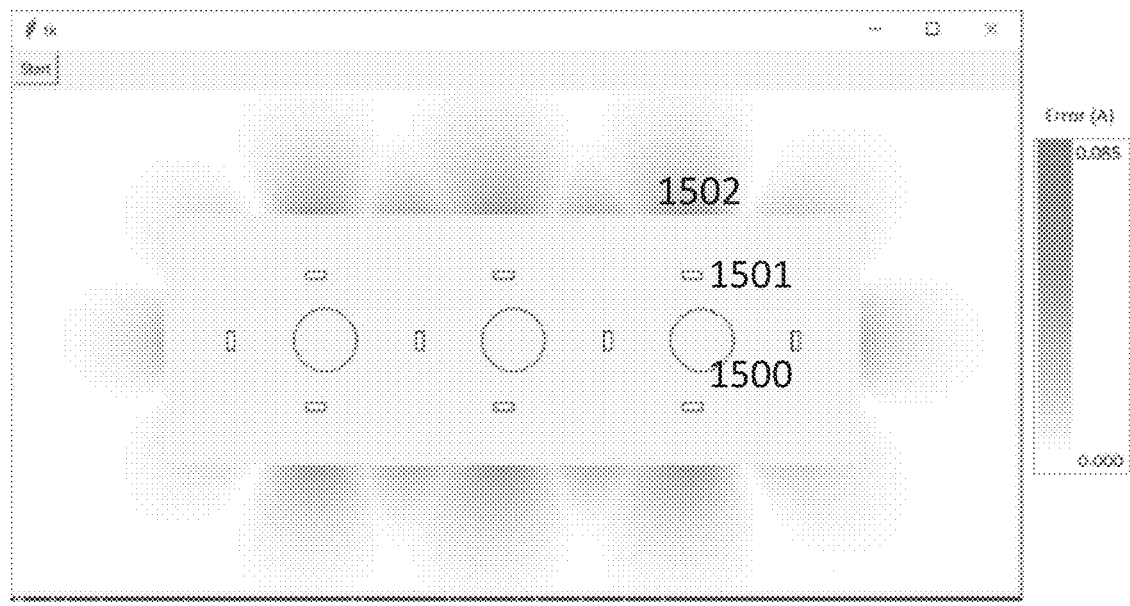
Figure 7:
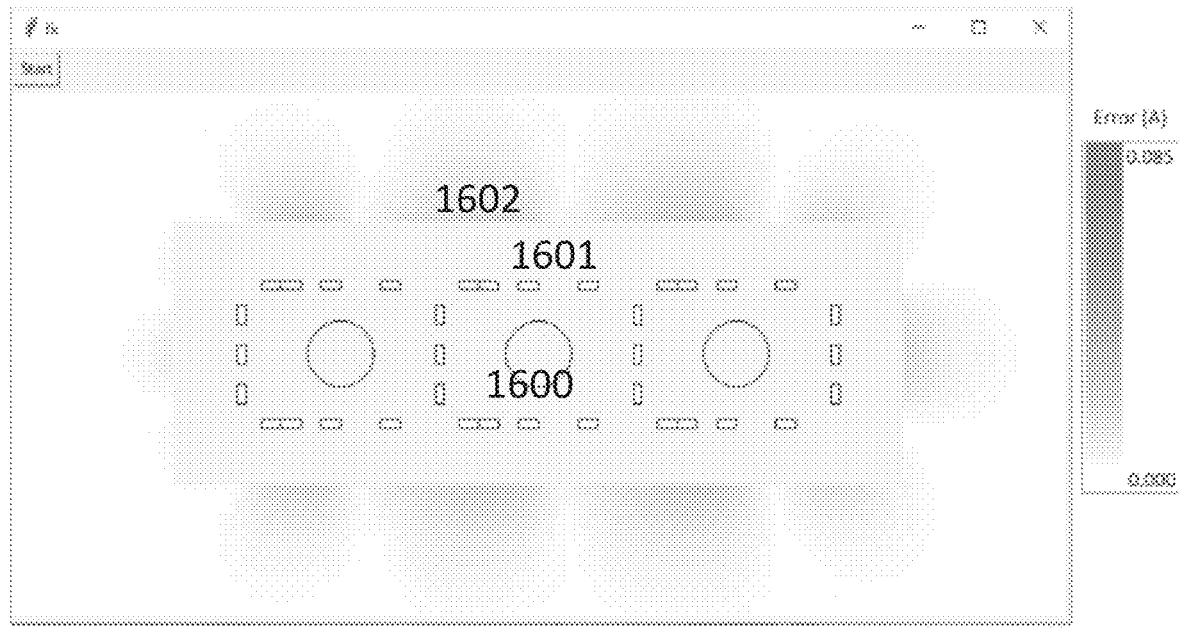

FIGS. 5 through 7 illustrate error maps for various proposed configurations of magnetic field sensors as described by the optimization problem listed above. These figures give an idea of the effect of increasing the number of sensors and optimizing their spatial orientation in order to minimize errors.

FIG. 5 shows the effect of having six sensors. The current-carrying cables 1400 are shown in relation to the sensor array 1401 and the resulting error heat map 1402. The scale is relative and is a function of the specific case studied, and is mainly of consequence when compared to subsequent plots that show a reduction in error as a result of placing additional sensors.

FIG. 6 shows the effect of placing ten sensors, where additional sensors have been introduced in-between and along the sides of the three cables being measured. Here again we see the current-carrying wires 1500, the sensor array which now has ten sensors 1501, and the resulting error map 1502 which is perceptibly lower when compared to the error map 1402 in the previous example of FIG. 5.

According to Ampere's Law, if an extremely high sensor density is utilized that completely encircled the conductor, a perfect estimate of the current in the wire could be obtained in theory. Therefore consider an extreme case in which thirty-six sensors are used. This would generally not be practical in practice due to cost and energy consumption of the individual sensors, but for the purposes of this numerical optimization it serves as a useful bounding case to consider. FIG. 7 shows the current carrying wires 1600, the 36-sensor array 1601, and the resulting error map 1602. It is seen that it is smaller, but not proportionally smaller, as compared to the ten-sensor array shown in FIG. 6. Notably, going from six sensors to ten sensors reduces current measurement error by about 56%, whereas going from six sensors to thirty-six sensors reduces the error by 87%.

As such, embodiments of the detector systems described herein may include between 2 and 6 magnetic field sensors per cable to be monitored, or between 3 and 5 magnetic field sensors per cable to be monitored. In other instances, the detector systems may include at least 2 magnetic field sensors per cable to be sensed, at least 3 magnetic field sensors per cable to be sensed, or at least magnetic field sensors per cable. In addition, the axis of sensitivity of each magnetic field sensor may be fixed in an orthogonal direction relative to a direction of current flow through the cables, and the axis of sensitivity of at least one of the magnetic field sensors may be perpendicular to the axis of sensitivity of at least one other one of the magnetic field sensors. The redundant array of magnetic field sensors may include a plurality of overlapping subsets of the magnetic field sensors, with each overlapping subset encircling a respective one of the cables (whether in a circular arrangement, a rectilinear arrangement or other arrangement). In some instances, the sensors may be arranged in a plane transverse to a direction of current flow through the cables. And in some instances, at least some of the magnetic field sensors may be arranged between the cable receiving locations, as shown in FIG. 6. In this embodiment, there are three overlapping subsets of four sensors around each cable with a respective shared sensor being positioned between each pair of adjacent cables.

Although only a few specific arrangement of sensors are illustrated in the figures, it is appreciated that the sensors may be arranged in a wide variety of configurations with respect to sensor location and sensor quantity, and may deviate based on the desired accuracy of a particular implementation (i.e., a higher precision product may include a greater number of sensors).

Algorithms Used to Derive Current Estimates from Magnetic Fields

In developing aspects of the detector systems and related methods described herein, various current estimation techniques were developed, adapted and evaluated. The various techniques are discussed below.

To evaluate different current estimation techniques, it was important to have a common error measurement and test scenario with which to compare performance. The error measurement chosen was:

$$\% \text{ Error} = \sum_{n=0}^{2} \frac{|I_n - \hat{I}_n|_1}{|I_n|_1} * 100$$

where $I_n$ is the true current in cable n and $\hat{I}_n$ is the estimated current in cable n. This error measurement was chosen because in many cases the evaluated currents were balanced three phase currents, and in such a case the value:

$$\Sigma_{n=0}^{2}|I_n|_1$$

is never zero, allowing the avoidance of division-by-zero problems.

The current estimation techniques include physics-based techniques, in which not only the internal currents were modeled but also sources of interference, and also include machine-learning based techniques, in which a training set of magnetic field readings were fit to their corresponding true current values. To determine which method performed best, a physics simulator and sensor placement function was utilized to simulate each method when using a different number of sensors for different test cases.

Ordinary Least Squares Estimator

Ordinary Least Squares (OLS) is a common technique used to solve a system of equations when the number of equations is greater than the number of unknowns. According to embodiments of the present invention, the number of sensors N is greater than the number of currents to be measured, and as such, an OLS technique can be used to form a current estimate. Since the relationship between the vector of currents and the vector of magnetic field readings is given by AI=b, the Ordinary Least Squares estimate is:

$$\hat{I}=(A^TA)^{-1}A^Tb$$

where $\hat{I}$ is the estimate, a vector of three currents. In developing aspects of the present invention, the performance of the OLS estimator was measured in the presence of several known disturbances. First the case of no external disturbance was considered. The case of a single wire, six wires, and a large metal plate were also considered as various cases of interference. The resulting performance of the OLS estimator is shown in the table below. Results are shown for six and ten sensors respectively.

| Case | With Six Sensors | With Ten Sensors |
| --- | --- | --- |
| No Interference | 0% | 0% |
| External Wire | 6.5% | 2.3% |
| Plate | 4.73% | 1.46% |
| Six Wires | 16.8% | 5.71% |

Ampere's Law Estimator

This estimator is based on Ampere's Law, which states:

$$\mu_0 I = \oint \vec{B} \cdot dl$$

Ampere's Law implies that if we were to measure the magnetic field along a closed loop around one cable, the magnetic fields generated by sources outside of the loop would sum to zero, and the magnetic fields generated by the cable and measured along the closed loop would be proportional to the cable current. Thus, measuring this integral would facilitate a current estimate free from external magnetic field interference. However, a very large and impractical number of sensors are required to measure a closed loop path around the current carrying cable to be sensed, which are too many to realistically include in a viable detector. Thus, the performance of approximating Ampere's Law with a limited number of sensors was explored.

The Ampere's Law estimator was based on the idea that the sum of the external magnetic fields detected by an array of sensors around a single cable should be zero. Say there are M sensors around a cable being used to form the Ampere's Law estimate. Each sensor m will detect a total magnetic field $b_{total}$, that is the sum of two magnetic fields: the field produced by the internal cable $b_{internal}$, and the field produced by external sources $b_{external}$. In a set of sensors that form a closed loop around a cable:

$$\mu_0 I = \Sigma_{m=1}^{M} b_{internal,m}$$

and $$0 = \Sigma_{m=1}^{M} b_{external,m}$$

Furthermore, the magnetic field created by the current estimate $\hat{I}$ is considered to be $a_i$, $\hat{I}$, where $a_i$, is the gain between cable i and sensor j from the gain matrix. The magnetic fields coming from external sources can be expressed as:

$$b_{total,m} = b_{internal,m} + b_{external,m}$$

$$b_{external,m} = b_{total,m} - b_{internal,m}$$

The condition that the external fields detected by all sensors sum to zero can then be imposed:

$$\sum_{m=1}^{M} (b_{external,m}) = 0$$

$$\sum_{m=1}^{M} (b_{total,m} - b_{internal,m}) = 0$$

-continued $$\sum_{m=1}^{M}(b_m - a_j\hat{I}_0) = 0$$

$$\sum_{m=1}^{M}b_m - \sum_{m=1}^{M}a_m\hat{I}_0 = 0$$

where $b_m$ is a more concise way of representing the total magnetic field detected by each sensor. The last expression can be rearranged to produce an estimate for the current $\hat{I}_0$, $$\hat{I}_0 = \frac{\sum_{m=1}^{M} b_j}{\sum_{m=1}^{M} a_j}$$

Note that this Ampere's Law estimator does not use all magnetic field sensors in the array to estimate each current. Rather, it uses a subset of the sensors that form a closed loop around each current. Thus, each current estimate $I_0$, $I_1$, and $I_2$ will be formed using three different subsets of sensors, although some sensors will appear in more than one subset. A flaw of this estimator is the nonzero estimate error when there is no external interference. This error occurs because the estimator attempts to estimate each current individually, without considering the other current carrying cables being sensed, which are thus treated as external currents. The results for the same aforementioned external disturbances is shown in the table below:

| Case | With Six Sensors | With Ten Sensors |
| --- | --- | --- |
| No Interference | 19.3% | 12.8% |
| External Wire | 23.6% | 11.8% |
| Plate | 15.8% | 13.3% |
| Six Wires | 38.5% | 10.5% |

Non-Linear Model Estimator

Another estimator involved modeling external sources of magnetic fields, and using these models to determine what components of the detected magnetic fields originated from external sources and what components came from the internal current carrying cables to be sensed. The external sources of interference of most concern are parallel external cables and parallel external plates, whose effects can also be modeled as external cables. The magnetic field detected by a sensor i as a result of the internal cables, an external uniform field, and P external cables is given by:

$$b_i(t) = \sum_{j=1}^{3}\alpha_{i,j}I_j(t) + u(t) + \sum_{k=1}^{P}\frac{\mu_0}{2\pi}\frac{(x_i - x_k)I_k(t)}{(x_i - x_j)^2 + (y_i - y_k)^2}$$

where $x_k$ and $y_k$ are the coordinates of each external cable, and $I_k(t)$ is the current of each external cable. In a system using N sensors, there will be a system of N equations of the above form. The parameters $\alpha_i$, and $y_i$ are known. The unknown variables are the three (t) terms, the uniform field (t), the locations of each external cable $x_k$ and $y_k$, and each external current (t). Thus, in a setup with P cables, there will be 4+3P unknown variables. This suggests a disadvantage of this estimator: the number of external cables that can be modeled is limited by the number of magnetic field sensors of the detector system.

Another problem with the Non-Linear Model estimator is that it is non-linear and cannot be solved using a linear least squares technique. After experimenting with non-linear optimization, it was found that although it was possible to generate accurate estimates, the results were sensitive to initial values entered into a minimization function. This was especially a problem when choosing what initial values to select for $x_k$ and $y_k$, since there are numerous regions around the current carrying cables to be sensed where an external cable could be located, and initializing these values to 0 returned poor results. For example in a trial with only one external wire as a disturbance, the sensitivity to initial conditions becomes readily apparent in the table shown below.

| Type | $I_0$ (A) | $I_1$ (A) | $I_2$ (A) | x (m) | y (m) | $I_{external}$ (A) | Percent Error |
| --- | --- | --- | --- | --- | --- | --- | --- |
| True Value | 0.926 | 0 | 0 | 0.02 | −.0025 | −0.926 | N/A |
| First Estimate | 0.912 | 0.196 | 0.182 | 0.9 | 0.0 | 0.029 | 14.1% |
| Second Estimate | 0.936 | −0.023 | 0.007 | 0.005 | −.022 | −.752 | 1.4% |

Due to the practical difficulties associated with sensitivity to initial conditions and computationally expensive calculations, the non-linear estimator is not believed to be a reliable estimator for the purposes of converting magnetic field measurements to currents.

Linear Model Estimator

Because of problems encountered when trying to minimize a set of non-linear equations, linear models of external interference were developed to use for current estimation. For example, the magnetic field created by one external cable would be approximated as:

$$b = a_1 x_e + a_2 y_e + a_3 I_e$$

where $x_e$ and $y_e$ are the coordinates of the external cable and $I_e$ is the current. Creating polynomial models of external interference was also explored. In a second order polynomial model of a single external cable, the magnetic field would not only be modeled as a linear function of the location and current variables, but also the pairwise products of these variables. This model would take the form:

$$b = a_1 x_e + a_2 y_e + a_3 I_e + a_4 x_e^2 + a_5 y_e^2 + a_6 I_e^2 + a_7 x_e y_e + a_8 x_e I_e + a_9 y_e I_e$$

To generate a linear model, the goal was to calculate coefficients such as $a_0$, $a_1$, and $a_2$, so that the resulting sum b is as close to the magnetic field predicted by the non-linear model as possible. To calculate these coefficients, a training set of 100,000 samples was generated. Each sample contained randomly chosen values for $x_e$, $y_e$ and $I_e$, with one of the constraints being that the location of the cable had to be outside of the frame supporting the magnetic field sensors. Each sample also contained the magnetic field b predicted by the non-linear model of an external cable, produced by the physics simulator. Effectively, a matrix D was generated to fit Dx=b for the training samples, where x is a vector of cable parameters and b is a vector of magnetic fields. We were minimizing the function $$\left(a_1 x_e + a_2 y_e + a_3 I_e - \frac{\mu_0(y_e - y_s)I_e}{(x_e - x_s)^2 + (y_e - y_s)^2}\right)^2$$

Once the linear model consisting of the matrix D was found, the full model for magnetic field readings could be formed by concatenating the gain matrix A that characterized the internal currents I with the matrix D, in the form $$[A \ D]\begin{bmatrix} I \\ x \end{bmatrix} = b$$

However, the model of a single external cable did not yield good results. A graph of the estimate error for the aforementioned test cases as a function of the number of sensors used and the estimation errors for six and ten sensors is shown in the table below. The estimation error for a second order polynomial model of an external cable was then analyzed. This model also performed inadequately.

| Case | With Six Sensors | With Ten Sensors |
|---|---|---|
| No Interference | 0.4% | 2.2% |
| External Wire | 43.7% | 9.2% |
| Plate | 15.4% | 7.1% |
| Six Wires | 24.9% | 17.2% |

Spatial Harmonics Estimator

This estimator uses the harmonic expansion of the solution to Laplace's Equation to create a general linear representation of external sources of magnetic fields. These linear components appear in pairs and will be referred to as (t) and (t). The linear representation of the magnetic field vector using the first M harmonics measured by a particular sensor i is repeated for convenience, $$H_i(r, \phi, t) = -\sum_{m=1}^{M} mr_i^{m-1}(a_m(t)\cos(m\phi_i) + b_m(t)\sin(m\phi_i))\hat{r} + \sum_{m=1}^{M} mr_i^{m-1}(b_m(t)\cos(m\phi_i) + a_m(t)\sin(m\phi_i))\hat{\theta}$$

where $r_i$ is the distance of the sensor from the origin of the coordinate system, Oi is the angle of the sensor location with respect to the coordinate system, and $\varphi_i$ is the orientation of the axis of sensitivity of the magnetic field sensor. In a system with N sensors, there will be N equations of the form given above. The number of unknowns will depend on the number of components of the linear representation that we include in the estimator. If the vector of $a_m(t)$ and $b_m(t)$ components is referred to as C, and the coefficients of these components as detected by the sensors is referred to as the matrix Q, then the full representation of the problem we are solving, including both internal currents and external components, is given by:

$$[A \ Q]\begin{bmatrix} I \\ C \end{bmatrix} = b$$

In the case of this estimator, augmenting the gain matrix A with columns to represent uniform magnetic fields is unnecessary, because the first harmonic of the linear representation of external magnetic fields corresponds to the uniform field columns. The performance of this estimator is shown in the table below.

| Case | With Six Sensors | With Ten Sensors |
|---|---|---|
| No Interference | 0% | 0% |
| External Wire | 6.5% | 1.7% |
| Plate | 4.7% | 1.0% |
| Six Wires | 16.8% | 5.4% |

Best Linear Unbiased (BLU) Estimator

Figure 8:
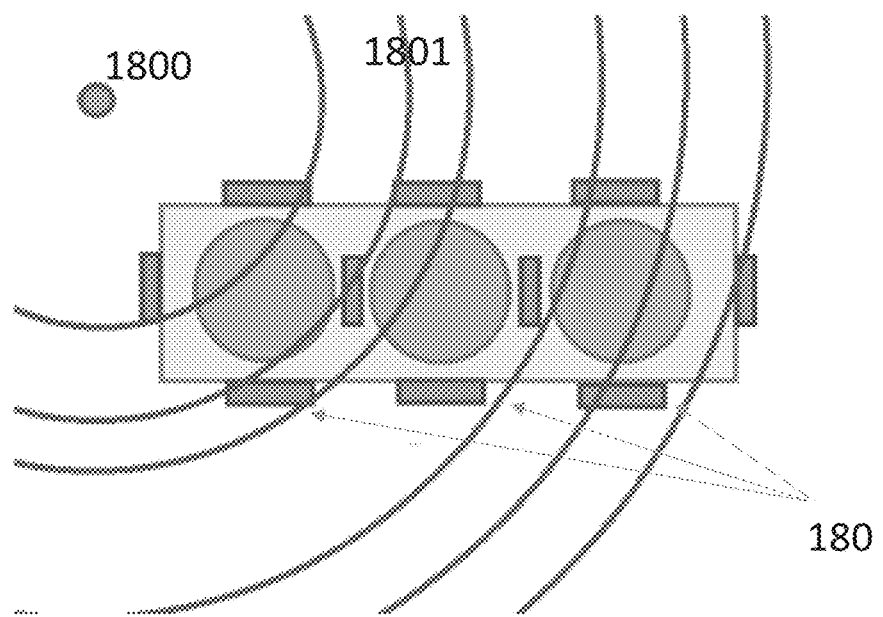
FIG. 8 is a schematic diagram illustrating a relationship between a magnetic field of an external magnetic field source and each of a plurality of magnetic field sensors.

A shortcoming of the OLS estimator discussed above is that it is optimized for the case in which external interference is uncorrelated across all sensors, which is not the case for external sources of magnetic fields. Magnetic fields from an external cable will be detected by each sensor according to a particular pattern. Thus, it is reasonable to believe that the external magnetic fields detected by the sensors will exhibit some correlation. This is schematically shown in FIG. 8. The external disturbance 1800 is in this case a wire. It radiates a field 1801 in a known pattern according to the Laws of Electricity and Magnetism, i.e., Maxwell's Equations. The various sensors 1802 will pick up this external disturbance, but their reading will be correlated according to their fixed geometric arrangement with respect to the field lines 1801.

More precisely, if a probabilistic distribution representing the possible locations and current values of external cables is defined, then the probabilistic magnetic fields detected by sensor i can be represented as a random variable $B_i$. This random variable is a scalar, the flux density that will be measured by each sensor. In the probabilistic model described here, the current value of an external cable will be characterized by a probabilistic distribution whose mean is 0, which means each random variable will have a mean of zero, or $E[B_i]=0$. This means that each pair $B_i$ and $B_j$ will have a correlation [ ] and covariance $co(B_i,B_j)$ that are equal. Furthermore, the correlations between every pair of sensors can be concisely represented by a covariance matrix, a matrix where the i, j-th term corresponds to the correlation [ ]. The value of the correlations will depend on the probabilistic model of external disturbances used.

This covariance matrix can be used to form a current estimate using a Best Linear Unbiased (BLU) estimator. Let it be assumed that a detector system contains N sensors. When the relationship between current and detected magnetic fields as characterized AI=b, the BLU estimate is given by:

$$\hat{I} = (A^T \Sigma^{-1} A)^{-1} A^T \Sigma^{-1} b$$

where A is the gain matrix and is an N by N matrix where the i, j term is the correlation $E[B_i B_j]$. If the sensor readings of the external fields were uncorrelated, the matrix $\Sigma$ would be a diagonal matrix and the above expression would simplify to the form of the OLS estimator. The performance of the present estimator depends on the covariance matrix and thus the probabilistic model used to derive the matrix. A first probabilistic model that was created involved three random variables: $X_e$, $Y_e$, the locations of an external cable, and $I_e$, the external current. $X_e$ and $Y_e$ were taken from a uniform distribution of locations around a frame supporting the sensors, excluding the area occupied by the frame.

Each random variable $B_i$ is a function of the location and current random variables to the same physical law that governs the detected magnetic field. The random variable $B_i$ for a sensor whose axis of sensitivity lies in the direction of the x axis can be expressed as:

$$B_i = \frac{u_0}{2\pi} \frac{(X_e - x_s)I_e}{(X_e - x_s)^2 + (Y_e - y_s)^2}$$

where $x_s$ and $y_s$ are the coordinates of the sensor. The random variable $B_i$ for a sensor whose axis of sensitivity lies in the direction of the y axis can be expressed as:

$$B_i = \frac{u_0}{2\pi} \frac{(Y_e - y_s)I_e}{(X_e - x_s)^2 + (Y_e - y_s)^2}$$

The random variable $I_e$ is independent of the random variables $X_e$ and $Y_e$. Furthermore, the expectation $[I_e]$ is 0, since it is a distribution symmetrically centered around 0 A. Therefore, the expectation of $B_i$ is:

$$E[B_i] = \int_{x_0}^{x_f} \int_{y_0}^{y_f} \int_{-10}^{10} \frac{u_0}{2\pi} \frac{(X_{e-x_s})I_e}{(X_e - x_s)^2 + (Y_e - y_s)^2}$$
$$p(X_e, Y_e)p(I_E)dI_e dX_e dY_e$$
$$= \int_{x_0}^{x_f} \int_{y_0}^{y_f} 0 \cdot p(X_e, Y_e)dX_e dY_e$$
$$= 0$$

The covariance matrix was approximated using a physics simulator. The simulator was run over a mesh of the previously stated ranges for the three random variables. During each run of the simulator, the program computed the detected magnetic field of each sensor as well as the pairwise products of the detected magnetic fields to compute both the expectation $[B_i]$ and the correlation [ ]. The performance of the BLU estimator technique is shown in the table below.

| Case | With Six Sensors | With Ten Sensors |
| --- | --- | --- |
| No Interference | 0% | 0% |
| External Wire | 6.6% | 0.1% |
| Plate | 4.7% | 0.3% |
| Six Wires | 17.0% | 1.8% |

It can be seen that the BLU estimator has unexpectedly high performance. As such, preferred embodiments of the present invention may employ a BLU estimator to derive an estimated current with particularly high precision.

Machine Learning Methods

Supervised machine learning techniques were also tested to explore whether the techniques could produce an estimator superior to any of the ones described above. The two principal machine learning techniques explored were regression and neural net training.

Regression Estimator

The regression estimator involved fitting a training set of magnetic field readings, both with and without external field interference, to the correct current readings for each training sample. The learning algorithm was effectively finding a matrix D and bias term f that would best fit the relationship db+f=I for all training samples. It did this by minimizing the total squared error between the true and estimated current. In other words, it minimized the expression given by $$\min \frac{1}{N} \sum_{n=0}^{N} (\hat{I}_n - (Db_n + f))^2$$

A physics simulator was used to generate a training set made of 1,000,000 samples. In each sample, a randomly chosen number of external cables were placed in the simulation. With 50% probability, this number was 0, so half of the training samples did not include external interference. In the other cases, 1-7 external cables were placed randomly around a frame supporting the sensors among the same range of locations used in the BLU estimator simulations. Each sample thus consisted of the magnetic field readings detected by the sensor and the true current values. Linear regression was used to fit the magnetic field readings to the current values. The results of this simulation when encountering the same external disturbances as discussed before are shown below.

| Case | With Six Sensors | With Ten Sensors |
| --- | --- | --- |
| No Interference | 8.3% | 1.3% |
| External Wire | 13.8% | 0.5% |
| Plate | 4.2% | 1.3% |
| Six Wires | 23.3% | 3.2% |

Experimentations with higher-level polynomial regression were also performed. This involved transforming the input vector of magnetic fields into a vector containing higher level products of the vector elements. In a 2nd degree transformation, this would mean transforming the input vector $b_0, b_1, \ldots, b_N$ into a vector that also includes all possible pairwise products, $b_20, b_0b_1, b_0b_2, \ldots, b_2 N$. In a third degree transformation, the vector is expanded to include all possible three-term product combinations, and so on. Once the vector b was transformed into a higher-level polynomial version of itself, linear regression using the same library function was used. This method allows one to fit a function based not only on magnetic field readings, but also on products of those readings, thus creating a function that better fits the relationships between readings. The results for the $3^{rd}$ degree transformation are shown below for the same set of established disturbances.

| Case | With Six Sensors | With Ten Sensors |
| --- | --- | --- |
| No Interference | 7.9% | 1.8% |
| External Wire | 7.4% | 3.2% |
| Plate | 13.1% | 2.0% |
| Six Wires | 19.2% | 1.7% |

Experimental Validation of Current Estimator

The following section relates to a lab-scale validation of the magnetic field and current estimation techniques described herein. The algorithm used for the estimator was the BLU algorithm as it exhibited unexpectedly high precision.

A parallel cable test bed was established to run 90 Hz current in a balanced three phase configuration while placing different forms of external interference around the detector. Experiments were run at 90 Hz to be able to distinguish between the interference created by the sources introduced and ambient 60 Hz magnetic fields. The various disturbances are described below.

Figure 9:
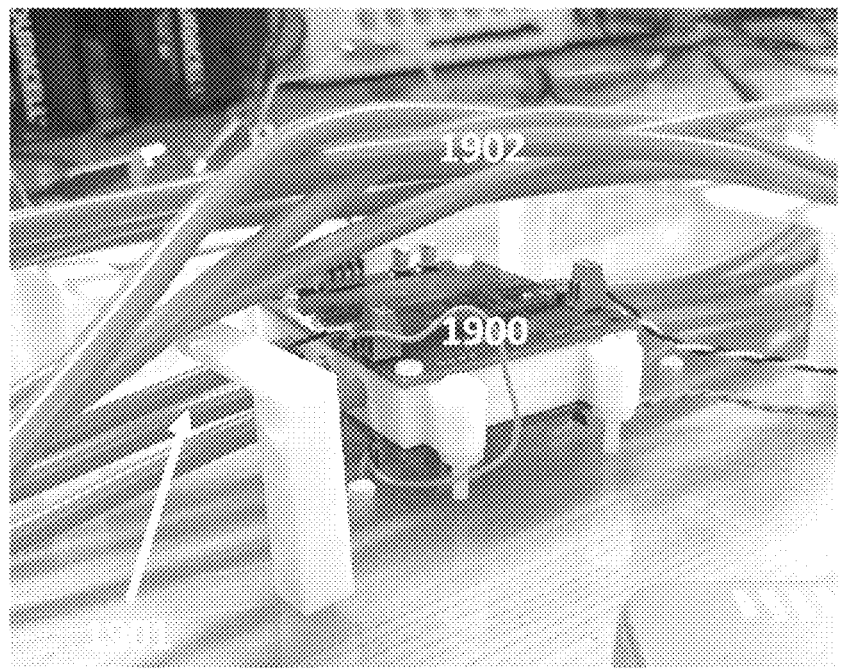
FIG. 9 is a perspective view of an experimental validation test setup of a detector system subjected to external magnetic field disturbances in the form of cables extending over the detector system.

Multiple Cables—FIG. 9 shows six cables arranged over the detector as an external interference. The detector 1900 has three cables 1901 to be sensed passing through its frame. The external cables 1902 are arranged so that they are above one side of the detector 1900.

Figure 10:
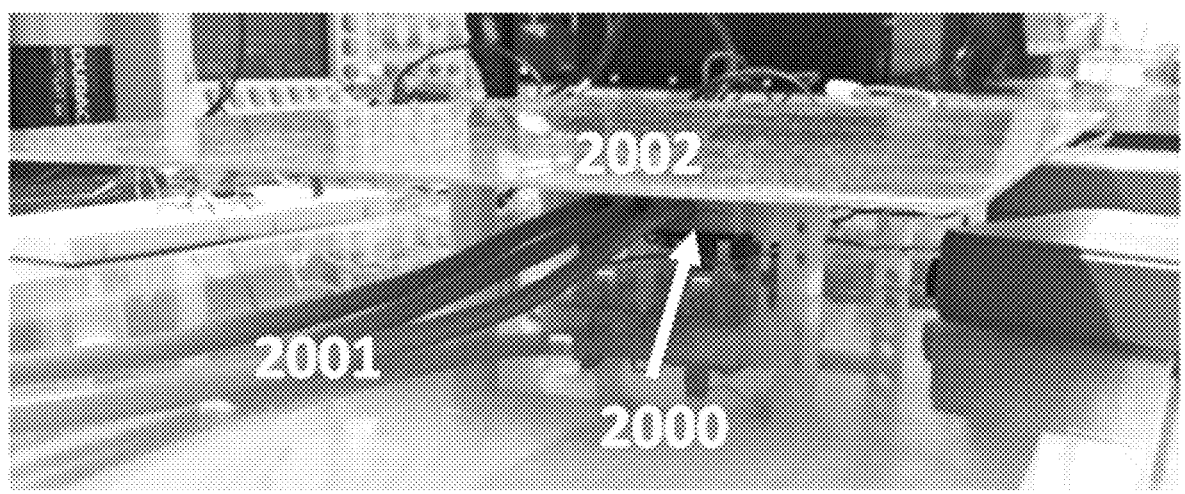
FIG. 10 is a perspective view of an experimental validation test setup of a detector system subjected to external magnetic field disturbances in the form of a metal plate extending over the detector system.

Metal Plate—To simulate the presence of a large metal conductor, such as the wall of an enclosure, a metal plate was positioned 1 cm above the detector as shown in FIG. 10. The detector 2000 is below the metal plate 2002, and three cables 2001 to be sensed pass through the frame as before. The external disturbance in this case is eddy currents in the plate.

Figure 11:
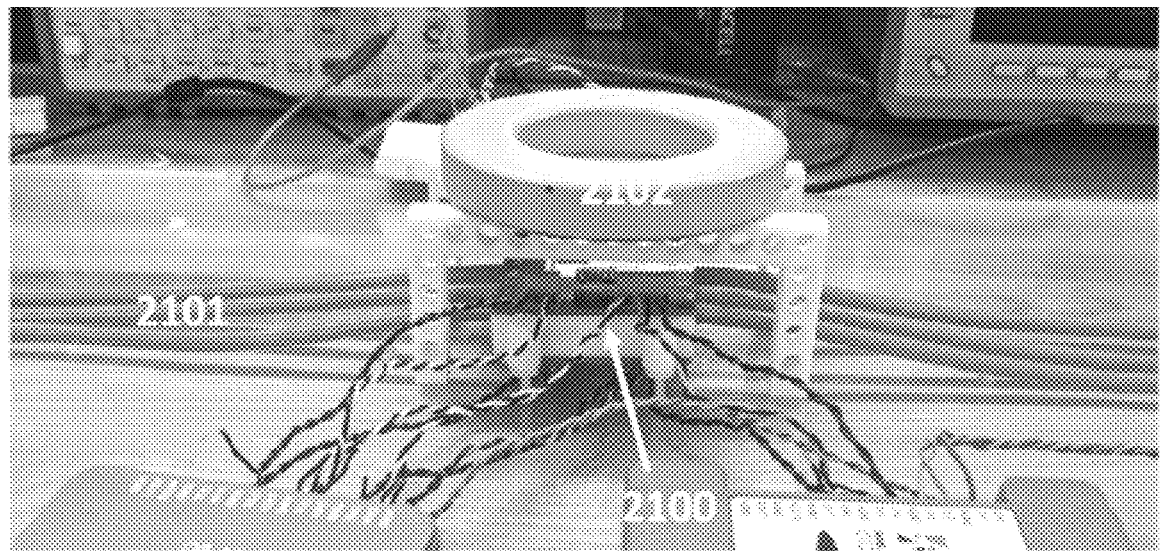
FIG. 11 is a perspective view of an experimental validation test setup of a detector system subjected to external magnetic field disturbances in the form of an iron core positioned over the detector system.

Iron Core—To simulate the presence of a strong magnetic material or magnetized material, an iron transformer core was placed 1.5 cm above the detector as shown in FIG. 11. The detector 2100 is below the iron core 2102, and the three wires 2101 to be sensed still pass through the sensor as before.

Figure 12:
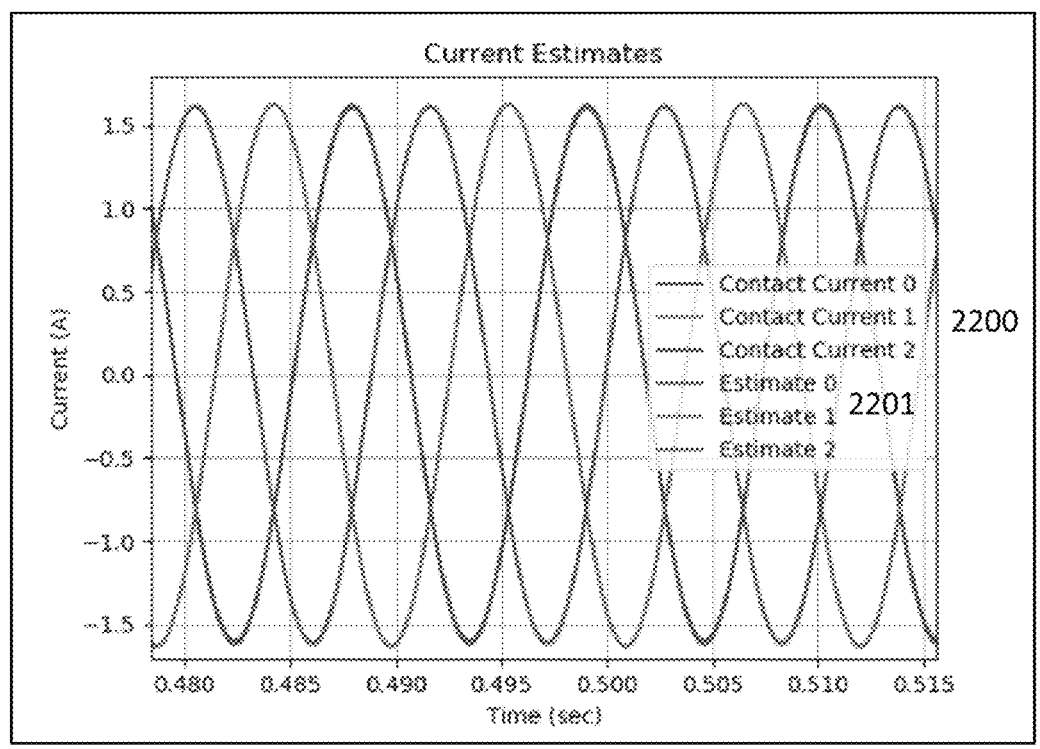
FIGS. 12-14 are plots of estimated currents generated according to embodiments of the present invention along with currents measured by a contact probe according to each of the test cases shown in FIGS. 9-11, respectively.
Figure 13:
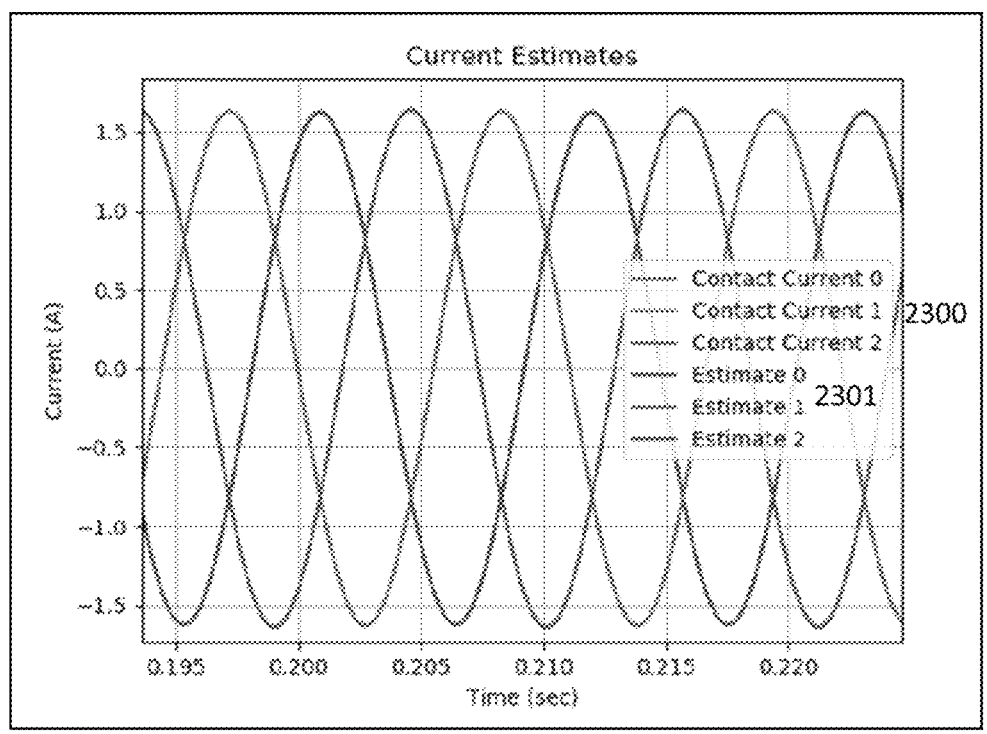
Figure 14:
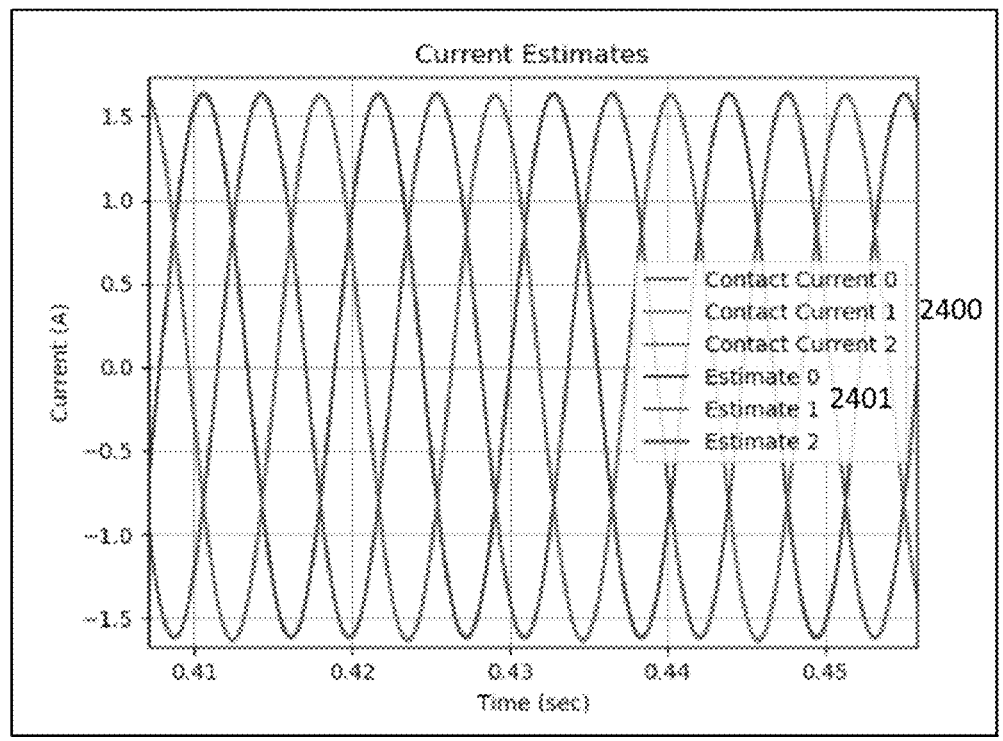

The various configurations of disturbances were tested as outlined above. The results were that in all cases, the sensor array of the detector with the BLU estimator was able to achieve a less than 1% error in current estimation, namely, 0.88% in the case of the external cables, 0.83% in the case of the metal plate, and 0.90% in the case of the iron core. The comparison was made by comparing the estimated currents to those measured by a contact probe that then went to an oscilloscope. FIGS. 12 through 14 show nearly complete overlap between the contact probe measurements and the generated estimates for each test case. In particular, FIG. 12 shows plots for the multiple cable test case, FIG. 13 shows plots for the metal plate test case, and FIG. 14 shows plots for the iron core test case.

As can be appreciated from the above, the detector systems and related methods of contactless current sensing advantageously provide a convenient and accurate way to measure the current in a series of cables despite the presence of external magnetic field disturbances and without requiring the energized system to which the cable belong to be shut down or disconnected.

Voltage Estimation from Electric Field Measurements

In addition to the current estimation functionality discussed above, embodiments of the detector systems disclosed herein may also be equipped or configured to generate voltage estimates through electric field measurements.

Figure 15:
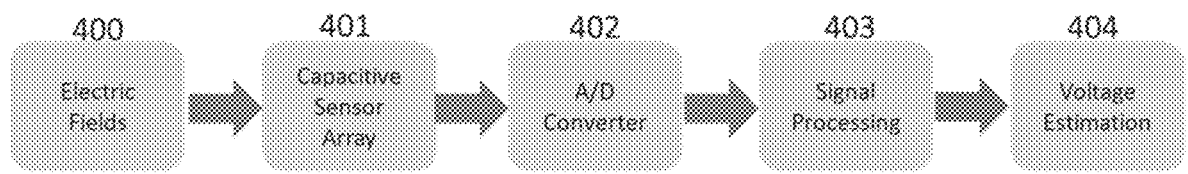
FIG. 15 is a process flow diagram for generating contactless voltage estimates.

The overall process for generating estimated voltages in accordance with embodiments of the present invention is outlined in FIG. 15. The electric fields 400 generated by cables within an energized electrical sensor are measured using an array of capacitive sensors 401. These sensors 401 will be described in greater detail in the subsequent sections of this disclosure. These sensors 401 will produce a voltage that is proportional or in some functional relationship to the magnitude of the electric field sensed. The sensors 401 generally will produce an analog voltage output, which must be then converted to a digital signal by the analog to digital converters (described in figure as A/D Converter) 402. Next, there are a multitude of signal processing steps 403 that allow noise rejection and accurate estimation of the voltage from the electric field data. Finally the voltage estimation 404 is produced and this information may be sent onwards to a monitoring system, data logger, control system, edge computing device, cloud computing, or some other data storage and processing system.

Figure 16:
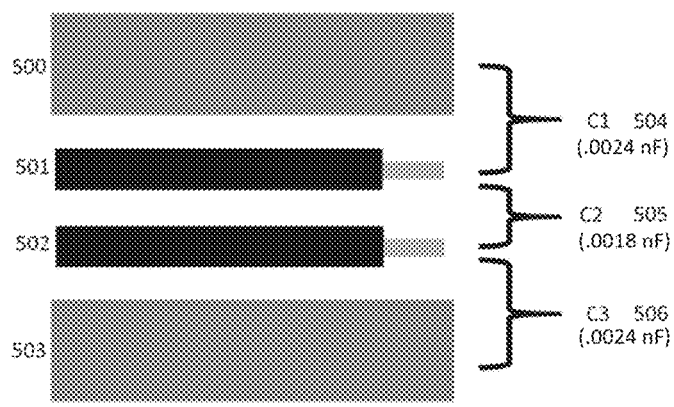
FIG. 16 is a schematic diagram of capacitive measurement probes.

Capacitive measurement probes 501, 502, according to one example embodiment, are described with reference to FIG. 16. Two current carrying cables 500, 503 are shown. The objective of the measurement is to measure the potential difference between these two cables 500, 503. The measurement probes 501, 502 (also referred to as measurement electrodes or capacitive sensors) lie between these two cables 500, 503. There exists multiple capacitances in this system creating a capacitive voltage divider. The capacitance between the first conductor 500 and the first measurement probe 501 is C1 504, the capacitance between the two measurement probes 501, 502 is C2 505, and the capacitance between the second measurement probe 502 and the second conductor 503 is C3 506. These capacitances will in general be very small, in the picofarad range. FIG. 16 includes actual capacitance readings in parentheses for all three capacitances described above for a typical test configuration used to measure the voltage in a three phase high voltage electrical system.

In order to reject external disturbances, the capacitive measurement probes shown in FIG. 16 are preferably shielded. There are at least two possible shielding configurations—a passive shielding approach and an active shielding approach.

Figure 17:
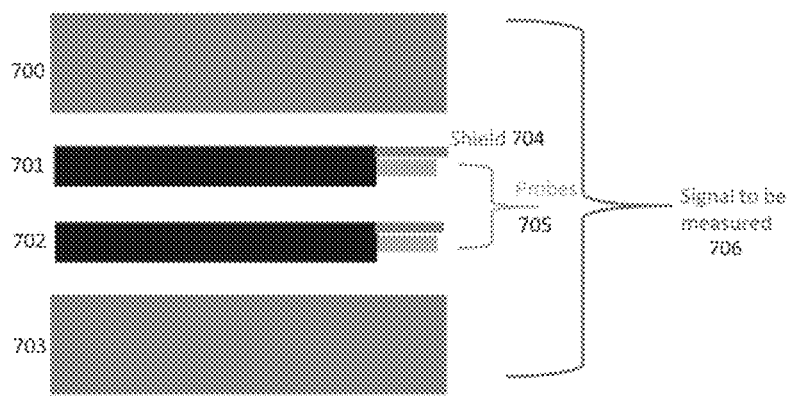
FIG. 17 is a schematic diagram of capacitive measurement probes with passive shields.
Figure 18:
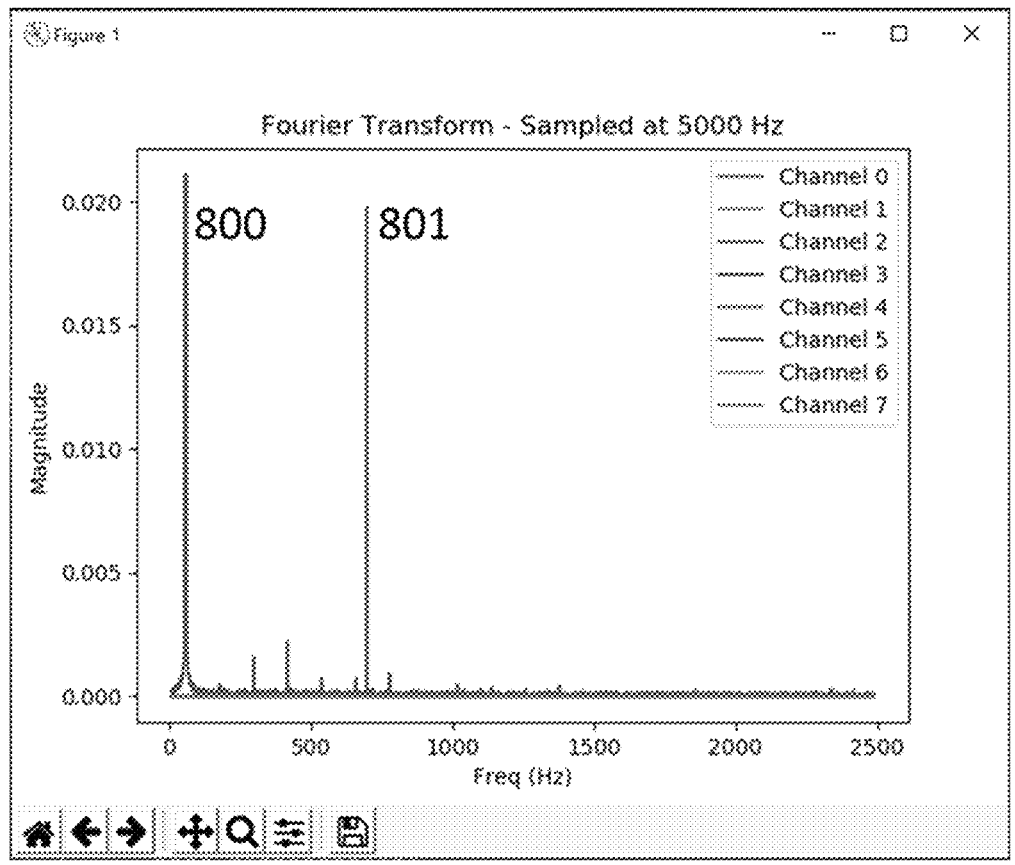
FIG. 18 is a Fourier Transform graph associated with the capacitive measurement probes with passive shields of FIG. 17.

FIG. 17 shows a passive shielding approach. The cables 700, 703 have a potential difference between them that represents the signal to be measured 706. The two probes 701, 702 have passive shields 704 and a potential difference between them 705. The passive shields 704 help protect the probes 701, 702 from the influence of electric fields other than those produced by the cables 700, 703. The exposed portion of the probes 701, 702 may still be susceptible to noise, but the greater length of the probes 701, 702 will be shielded and thus will not pick up stray electric fields such as those commonly produced by the 60 Hz background field in the US (50 Hz in the rest of the world) produced by a multitude of energized electrical equipment in proximity to the two specific cables 700, 703 being interrogated. The passive shield unfortunately still allows significant 60 Hz background noise onto the capacitive measurement probes 701, 702. As a test of the relative magnitude of this noise, a 5V voltage differential was established between the cables 700, 703. The frequency of this AC voltage was chosen to be 700 Hz, which is very distinct from the background 60 Hz noise. The signal was collected on the probes 701, 702 and the Fourier Transform of the probe voltage data was performed. The result is shown in FIG. 18. The peak at 60 Hz 800 is almost as large as the peak at 700 Hz 801. Note that the 700 Hz signal is only at 5V, which is significantly lower than the voltage of a real industrial system, which could have an RMS—root mean square—value of 480V. Nevertheless there is a noise component at 60 Hz in the passive shield configuration of FIG. 17 that is non-negligible.

Figure 19:
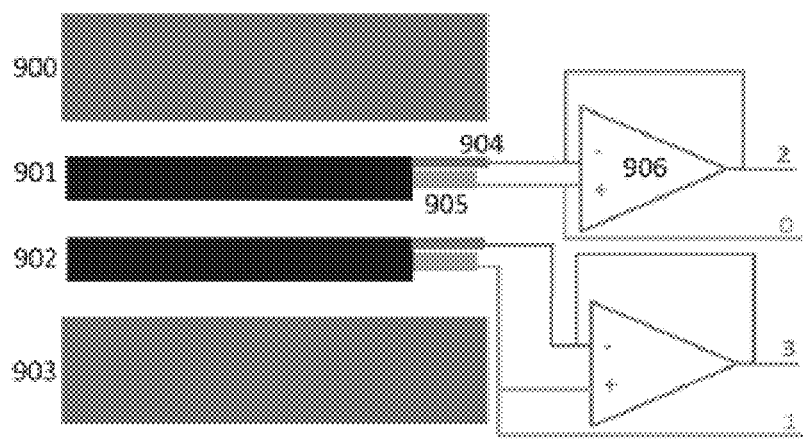
FIG. 19 is a schematic diagram of capacitive measurement probes with active shields.
Figure 20:
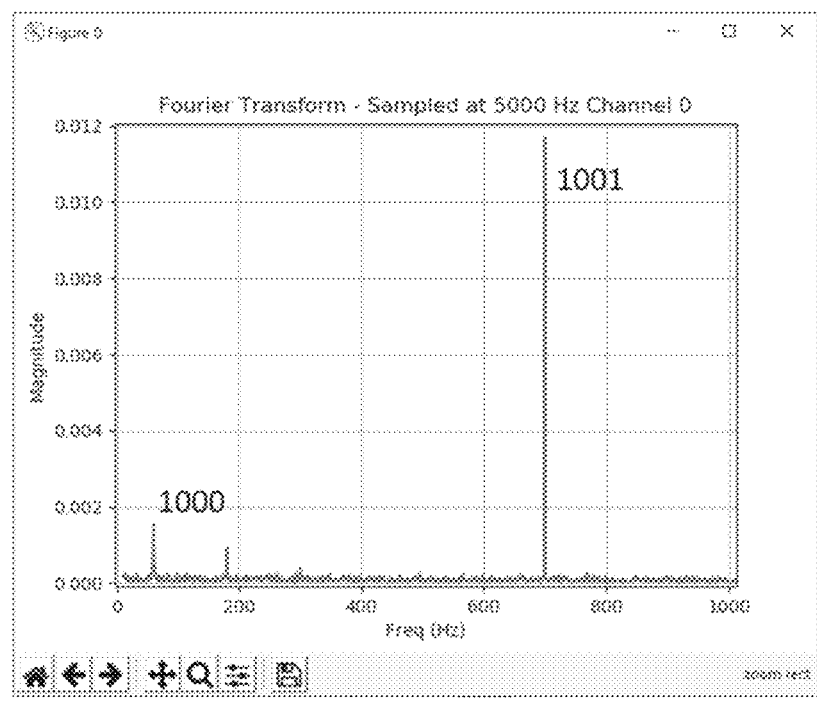
FIG. 20 is a Fourier Transform graph associated with the capacitive measurement probes with active shields of FIG. 19.

To help overcome the effects of such noise and the inability of the passive shield to make the background 60 Hz noise negligible, an active shielding method was implemented in connection with particularly advantageous embodiments of the present invention. This is schematically shown in FIG. 19. The cables 900, 903 have a potential difference between them that is to be measured by probes 901 and 902. In this configuration however the probes have shields 904 that are fed into an operational amplifier (op-amp) 906 such that the active part of the probe 905 and the shield 904 are both inputs to the op-amp 906 and there is a feedback loop such that the shields 904 are actively driven by the op-amps 906 to be at the same potential as the central probe conductors 905. The noise rejection capability of this configuration will be superior to a passive shield, as demonstrated in FIG. 20. This figure shows a Fourier Spectrum similar to that of FIG. 18. Now the 60 Hz peak 1000 is significantly lower than the peak produced by the 5 V signal at 700 Hz 1001. In fact, the 5V, 700 Hz signal now has a seven fold higher peak in the frequency domain as compared to the background 60 Hz noise. This demonstrates the ability of the active shield to significantly lower the background noise caused by ambient 60 Hz fields. One thing to note here is that the array of capacitive measurement probes 901, 902 is that they represent the derivative of the voltage signal between the cables 900, 903 being measured. Therefore to arrive at accurate voltage estimations, the integral of the signal is taken thereby providing the actual sensed voltage difference between the cables 900, 903.

Figure 21:
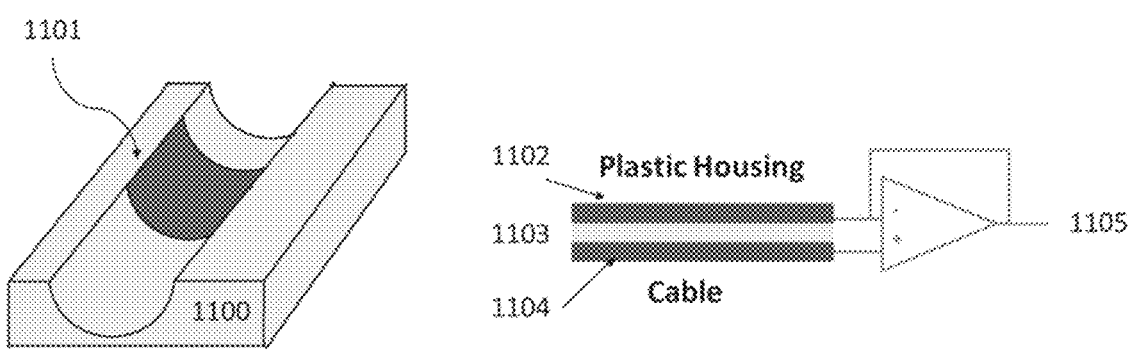
FIG. 21 provides schematic representations of a capacitive measurement probe according to one particularly advantageous embodiment.

To further improve the ability of the capacitive probes to detect the voltage going through a specific conductor and to further enhance the ability of the capacitive probes to reject noise, an alternative configuration is possible that places both the two probes in another configuration. The two conductors that form the two electrodes or plates of a capacitor of the probe could be placed in a concentric radial configuration as shown in FIG. 21. A frame 1100 that holds the cables to be in a fixed position also holds the capacitive measurement probes 1101 which are concentric and radially positioned with respect to the main axis of the cable (not shown). Looking at the schematic of the capacitive measurement probe circuit and elements of the overall probe, we have the two electrodes 1102 and 1104 separated by an insulating layer 1103. The electrode 1102 is the electrode that is closer to or faces the frame 1100, whereas electrode 1104 is the electrode that is in direct contact with the cable being interrogated. As was the case in the previously discussed probe configuration, there is an operational amplifier circuit 1105 which is used as an active shield and enables noise rejection from external or spurious electric fields other than those being measured.

Figure 22:
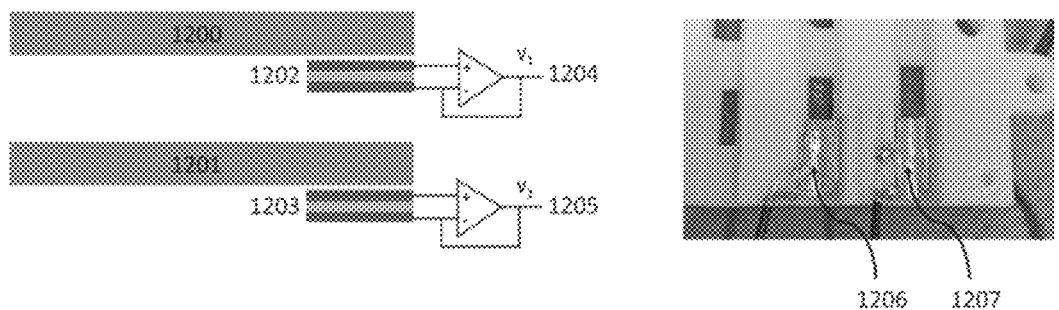
FIG. 22 includes a schematic representation of a set of capacitive measurement probes and an image of a corresponding prototype thereof.

When measuring multiple cables, the configuration describe above can be readily duplicated. This is shown in FIG. 22. Two cables 1200 and 1201 are shown that are to be measured. The sensor arrays 1202 and 1203 have attached to them the active shields 1204 and 1205, respectively. Actual prototype sensor arrays 1206 and 1207 are shown corresponding to the schematic arrays 1202 and 1203 at right in FIG. 22 for comparison.

Figure 23:
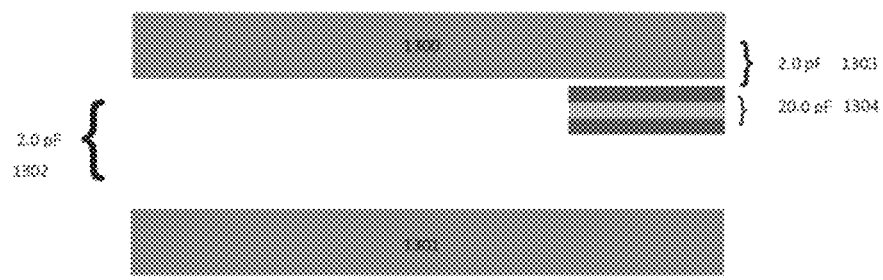
FIG. 23 is a schematic representation of a capacitive measurement probe and cable arrangement with associated capacitances.

To see how much signal amplification is possible by using this concentric radial sensor configuration, we refer to FIG. 23. This figure schematically shows one configuration of the concentric radial sensor with an electrode length of 1.25 cm and the associated capacitances. As measured, the two cables 1300 and 1301 have a capacitance of 2.0 pF between them as indicated in 1302; the outer electrode of the capacitive sensor assembly 1304 has a capacitance with the cables (in this case one of the cables shown as 1300) of 2.0 pF as indicated in 1303; and the intra-electrode capacitance of the capacitive probe 1304 is 20 pF. It is instructional to compare this to the previous capacitive probe configuration discussed above which did not have the geometric form factor embodied in the concentric and radially arranged sensor.

With this background, specific methods used for voltage estimation and the methods by which a 1% or less error can be achieved are discussed. Also discussed, is experimental lab-scale validation of this 1% or less error.

Figure 24:
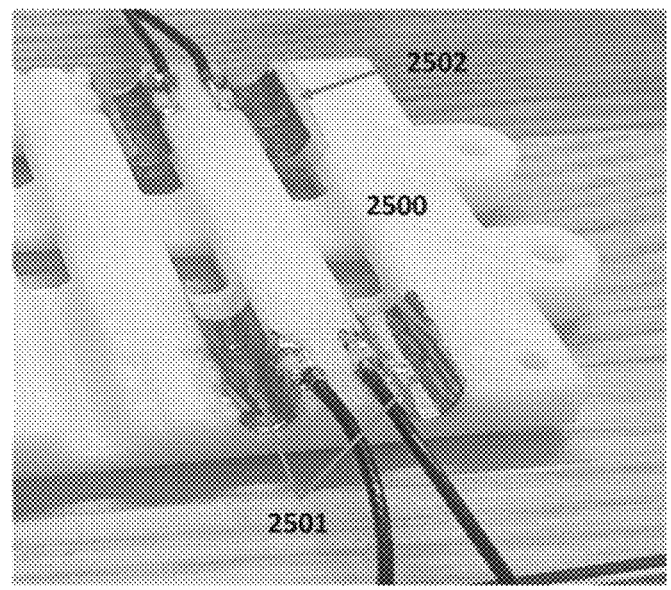
FIG. 24 is a perspective view of a portion of a detector for contactless voltage sensing, according to one example embodiment, including capacitive sensing electrodes and capacitive calibration electrodes supported in a frame along cable receiving passages thereof.

The physical construction of a prototype unit of a particularly advantageous embodiment of a voltage measurement system is shown in FIG. 24. The frame 2500 has channels in it that can accommodate sensing electrodes 2501. There is a dielectric material 2502 behind the sensing electrodes 2501. Not shown in this picture is another set of shielding electrodes that lie beneath the dielectric material 2502. Each of the sensing electrode 2501, the dielectric material 2502 and the shielding electrode (not visible) may be provided in the form of a thin substrate (foil in the case of the electrodes) that has a semi-cylindrical shell form factor.

Figure 25:
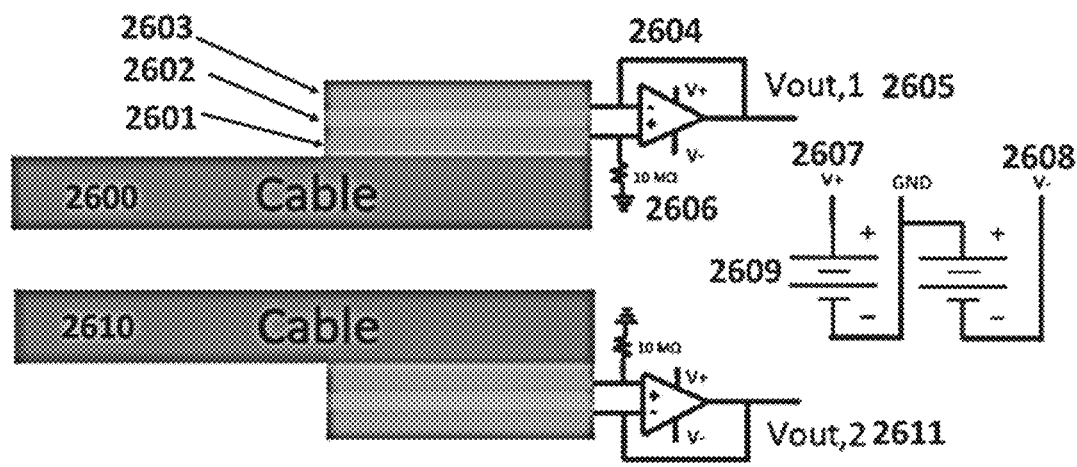
FIG. 25 is a schematic representation and electrical circuit diagram of the capacitive sensing electrodes of FIG. 24.

The electrical circuit diagram for this measurement system is shown in detail in FIG. 25. The cables that are to be monitored are labeled 2600 and 2610. The measurement system will measure the voltage difference between cables 2600 and 2610. As the measurement system does not share a common ground with the cables 2600 and 2610 being measured, only differential voltage measurements are possible here. However, if there were a neutral or ground wire as well as "hot" phase wires, on could of course measure the differential voltage between those cables as well, provided again that the system being measured does not share a common ground with the measurement system.

The measurement system includes a sensing arrangement comprising a primary sensing electrode 2601, a dielectric isolator 2602, and a shielding electrode 2603. The dielectric isolator 2602 isolates the sensing electrode 2601 from the shielding electrode 2603. To shield the sensing arrangement from external electric fields, the shielding electrode 2603 (e.g., copper tape) is driven to the same potential as the sensing electrode 2601 by an operational amplifier 2604. To provide a reference to the ground of the sensing circuit, a bypass resistor 2606 is included between the sensing electrode 2601 and ground. Therefore, with this reference point, which is again not the same ground reference as the cables 2600, 2610 being measured, it is possible to measure the line to line voltage between cable 2600 and cable 2610 by taking the difference of the two outputs of the operational amplifiers, namely 2605 and 2611.

There is an additional step before arriving at a true voltage estimation. The sensing electrode and the cable being sensed may be viewed as two nodes connected by a capacitor. This means that the electrode voltage would be the derivative of the cable voltage. Thus, to form the voltage estimate, a running sum of the electrode voltage signal if taken. The voltage estimate Vest was formed by:

$$V_{sum}[i] = \sum_{n=0}^{i}(V_{electrode}[n] - \text{avg}(V_{electrode}))$$

$$V_{est}[i] = \alpha(V_{sum}[i] - \text{avg}(V_{sum}))$$

The parameter α is a parameter that depends on dielectric material properties, and therefore is an adjustable calibration parameter. The following section will discuss a specific method for auto-calibration; however, initial trials were conducted by manually selecting the parameter to match a known voltage without any external disturbances to within a 1% error. Then the same disturbances discussed previously with the current detection were introduced in the voltage detection. The results of the sensor with and without the active shielding are shown in the table below.

| Case | No Shielding (% Error) | With Shielding (% Error) |
|---|---|---|
| No Interference | 0.1087 V | 0.0463 V |
| Aluminum Plate | 0.1113 V (2.4%) | 0.0461 V (0.4%) |
| Iron Plate | 0.1111 V (2.2%) | 0.0461 V (0.4%) |
| Hand | 0.1121 V (3.1%) | 0.0462 V (0.2%) |

As can be appreciated from the present disclosure, the unknown dielectric properties of the insulating materials are an important term that appears in the equation that enables voltage estimation. One approach is to preset this parameter to within 1% accuracy in comparison with a known voltage source. However, this is often not practical in the field. There are expected to be environmental changes which will require periodic adjustment of this constant to maintain an accurate voltage estimate. It is therefore highly desirable to have an automated method for calibration.

Figure 26:
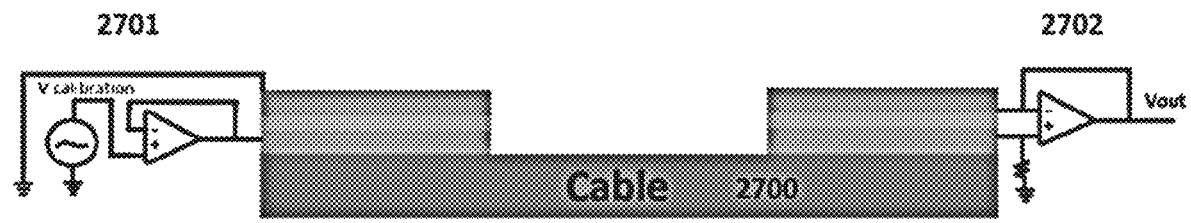
FIG. 26 is a schematic representation and electrical circuit diagram of a sensing arrangement including a capacitive sensing electrode and a capacitive calibration electrode positioned at offset locations along a cable.

In FIG. 26 we see the cable 2700 to be measured. To calibrate the system, a known signal is applied to the calibrating electrode 2701 which capacitively injects a voltage into the cable 2700 that then creates a voltage in the sensing electrode 2702. The calibration electrode 2701 and the sensing electrode 2702 are preferably equal in width and length (so as to have the same capacitive properties), but are spaced apart from each other a sufficient distance (e.g., 3 cm) to have minimal cross-capacitance. The calibration electrode 2701 is protected by a shielding electrode driven to ground.

A known voltage is applied to the calibration electrode through a buffering op-amp. The calibration voltage induces a voltage in the power cable through the calibrating electrode capacitance. The voltage in the power cable then induces a voltage in the sensing electrode through the sensing electrode capacitance. If these two capacitance values are equal, the system can be modeled as a circuit in which there are two capacitors in series between the calibration voltage and the sensing electrode voltage with the same capacitance $C_1$. Once the transfer function between the calibration voltage and the electrode voltage is known, it is possible to solve for the electrode capacitance.

To perform calibration, it is preferred to use a portable power source (e.g., a pair of 6 V batteries) to supply power to the detector system, rather than using a power supply connected to the wall. This is because when the detector is plugged into wall power, the unknown impedance between the cable and the ground of the detector is too low and provides a shunting path for the calibration voltage that will redirect the calibration signal away from the sensing electrode.

Figure 27:
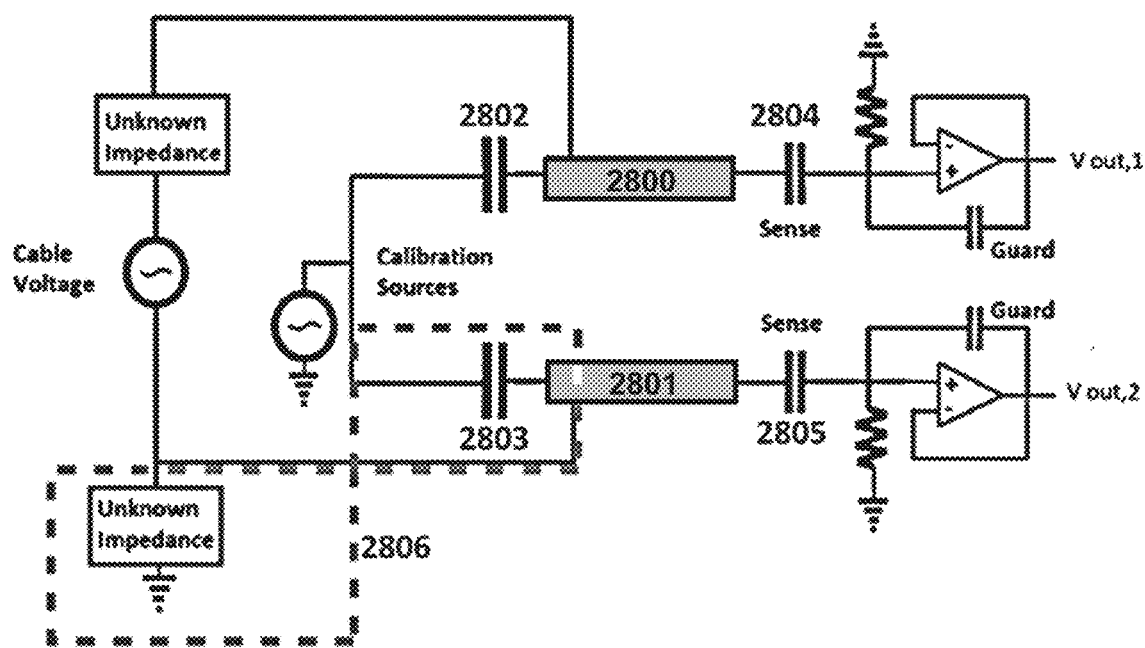
FIG. 27 is an electrical circuit diagram of a calibration system model according to one example embodiment.

This is shown in FIG. 27. The cables to be sensed 2800 and 2801 each have calibration electrodes 2802 and 2803 as well as sensing electrodes 2804 and 2805. If all systems are connected to the same ground, then there is an unknown impedance loop 2806 that could shunt the calibration signal if it is too low.

There is another significant component to the model of the calibration system: a parasitic capacitance between the power cables and the ground of the detector system. This capacitance exists due to the electric field lines emanating through the air and connecting the power system and the detector system. Although this capacitance would normally be negligible in most electrical applications, the high impedances involved in the calibration system caused this parasitic capacitance to affect the outcome of experimental results. Additionally, the op-amp has internal dynamics that must be modeled as its behavior is non-ideal. These are also taken into account in the overall model for the sensing and calibration circuits.

Figure 28:
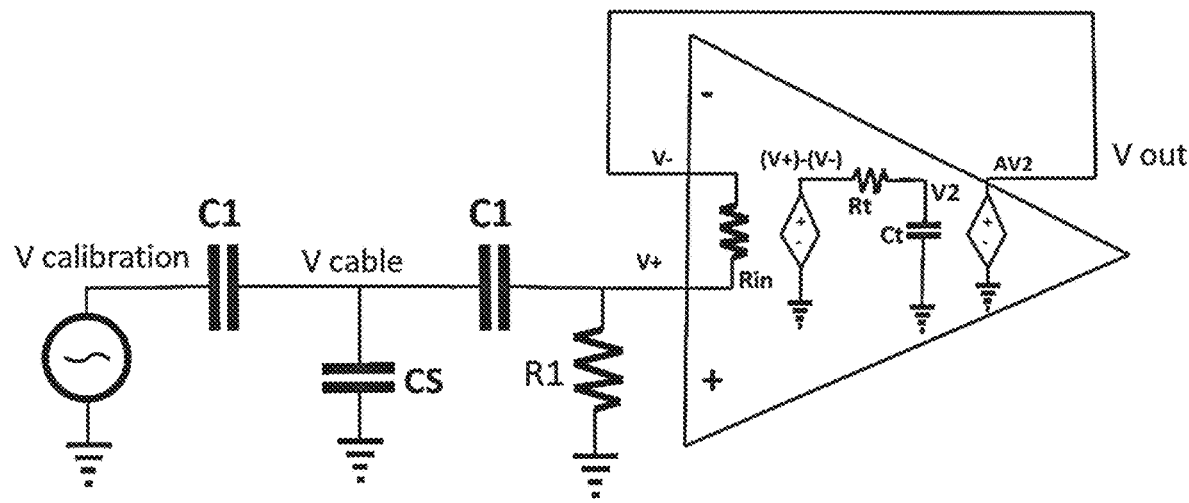
FIG. 28 is an electrical circuit diagram of a calibration system model according to one example embodiment used to generate a lumped parameter model for calculating an unknown capacitance of a capacitive sensing electrode.

FIG. 28 shows this overall lumped parameter model that accounts for the shunt capacitance as well as the op-amp characteristics. This lumped parameter model is characterized by the equation below:

$$\frac{V_{out}}{V_{calibration}} = H_c(j\omega) = \frac{j\omega AR_1 R_{IN} C_1^2}{d(j\omega)}$$

$$d(j\omega) = (2C_1 + C_S)(R_{IN} + R_1 + R_{IN}A) +$$
$$j\omega\bigl((2C_1 + C_S)\tau(R_1 + R_{IN}) + (C_1^2 + C_S C_1)R_1 R_{IN} C_1(A+1)\bigr) +$$
$$(j\omega)^2 \tau R_1 R_{IN}(C_1^2 + C_S C_1)$$

To prepare this function for curve fitting, the numerator term is divided into the denominator, and the approximation that $A+1 \leq A$ is made, since A is typically around 100,000. The transfer function then simplifies to $$\frac{V_{out}}{V_{calibration}} = H_c(j\omega) =$$

$$\frac{j\omega}{\left(\frac{2C_1+C_S}{C_1}\right)\frac{1}{R_1 C_1} + j\omega\left(\left(\frac{2C_1+C_S}{C_1}\right)\frac{(R_{IN}+R_1)\tau}{AR_1 R_{IN} C_1} + \frac{C_1+C_S}{C_1}\right) + (j\omega)^2 \frac{\tau}{A}\left(\frac{C_1+C_S}{C_1}\right)} = \frac{j\omega}{a_c + j\omega b_c + (j\omega)^2 c_c}$$

The capacitance $C_1$ is estimated by taking voltage measurements to solve for the parameters of (jω), the transfer function between the cable and the output voltage, and (jω), the transfer function between the calibration voltage and the output voltage. Due to hardware limitations, it was possible to only solve for two parameters in either transfer function. However, the term $(R_{IN}+R_1)/AR_1$, which we can refer to as the hardware term h, appears in both transfer functions. It was thus possible to use the four transfer function parameters to solve for the three unknown values, $C_1$, $C_s$, and h.

To estimate the capacitance, voltages were first applied directly to the power cable to determine the parameters a and b of transfer function (jω). The parameter b allows one to solve for the hardware term h, since $b=1+h/C_1$. This hardware term should stay the same when the detector is removed from one cable and attached to another, since it does not involve the value of the electrode capacitance. Therefore, this term can be determined when the detector is manufactured. One can then estimate the capacitance by applying voltages to the calibration electrode to determine the values of the parameters $a_c$ and $b_c$ of transfer function (jω). Then, we can estimate $C_1$ using the formula $$\hat{C}_1 = \frac{1 + b_c - R_1 a_c h}{R_1 a_c}$$

where $\hat{C}_1$ is the estimate of the capacitance.

Notably, the above calibration technique to establish the capacitance can be automated or semi-automated in the detector system to allow periodic re-calibration of the capacitance value of the capacitive sensing electrode, to thereby maintain high accuracy of the detector in estimating a voltage differential between the cables to be monitored despite the presence of external disturbances and fluctuating environmental conditions.

Although embodiments of the invention are described herein predominately in the context of sensing current and voltage of current carrying cables of an energized system, it is appreciated that embodiments of the invention can apply to various other current carrying conductors, such as bus bars, insulated wires and the like.

In light of the above, it will be appreciated that a variety of current and/or voltage detector systems and related methods may be provided in connection with the various features and functionalities described herein. For instance, non-exclusive example embodiments of the detector systems and related methods of the present invention are outlined below.

According to one example embodiment, a detector system for contactless current sensing may be summarized as including: a frame having conductor receiving locations configured to receive a plurality of current carrying conductors and to support the conductors in a fixed arrangement relative to the frame; a plurality of magnetic field sensors supported by the frame in a redundant array in a fixed relationship with respect to the conductor receiving locations to sense a magnetic field in a vicinity of the conductors during operation; and a computing system communicatively coupled to the magnetic field sensors, the computing system configured to receive magnetic field data from the redundant array of magnetic field sensors and to generate an estimated current by utilizing an estimator algorithm that accounts for external magnetic field disturbances on the magnetic field in the vicinity of the conductors to enhance the accuracy of the contactless current sensing of the detector system.

Each magnetic field sensor may be configured to output a voltage linearly proportional to a component of a magnetic field along an axis of sensitivity of the magnetic field sensor. The axis of sensitivity of each magnetic field sensor may be fixed in an orthogonal direction relative to a direction of current flow through the conductors. Furthermore, the axis of sensitivity of at least one of the magnetic field sensors may be perpendicular to the axis of sensitivity of at least one other one of the magnetic field sensors. The redundant array of magnetic field sensors may include a plurality of overlapping subsets of the magnetic field sensors, with each overlapping subset encircling a respective one of the conductors. The magnetic field sensors may be arranged in a plane transverse to a direction of current flow through the conductors. At least some of the magnetic field sensors may be arranged between the conductor receiving locations. A number of the magnetic field sensors may be at least two, three or four times a number of the current carrying conductors to be sensed. Each magnetic field sensor may be a Hall effect sensor, a fluxgate sensor, or a tunneling magnetoresistive sensor. The detector system may be devoid of electromagnetic shielding around the redundant array of magnetic field sensors.

The computing system may comprise a memory configured to store processor-executable instructions and a processor in communication with the memory that is configured to execute the processor-executable instructions to perform operations comprising receiving the magnetic field data from the redundant array of magnetic field sensors and generating the estimated current based on said magnetic field data. The estimator algorithm may comprise one of the following: an Ordinary Least Squares estimator technique; an Ampere's Law estimator technique; a Non-linear Model estimator technique; a Linear Model estimator technique; a Spatial Harmonics estimator technique; a Best Linear Unbiased estimator technique; a Machine Learning estimator technique; and a Regression estimator technique. In one particularly advantageous embodiment, the estimator algorithm is based on a Best Linear Unbiased estimator technique. The computing system may be configured to generate the estimated current without employing frequency filtering of a frequency of an energized system to which the conductors belong.

The frame may be configured to be removably secured to the conductors without disconnecting the conductors from an energized system to which the conductors belong. For example, the frame may have a multiple part construction (e.g., hinged clam shell form factor) that clips or clamps around the conductors.

In some instances, the detector system may be further configured for contactless voltage sensing and may further comprise, for each of at least two of the conductors, a voltage sensing arrangement. The voltage sensing arrangement may include a capacitive sensing electrode with an active shield provided at a first location along a length of a conductor passage for the conductor; and a capacitive calibration electrode with an active shield provided at a second location offset from the first location along the length of the conductor passage, and the computing system may be further communicatively coupled to each voltage sensing arrangement and configured to receive calibration data from the voltage sensing arrangements and to generate an estimated capacitance value of the capacitive sensing electrode based in part on said calibration data. The computing system may be further configured to generate an estimated voltage differential between the two conductors based in part on the estimated capacitance values of the capacitive sensing electrodes. The capacitive sensing electrode may include a measurement electrode, a shielding electrode, a dielectric substrate between the measurement electrode and the shielding electrode to isolate the measurement electrode from the shielding electrode, an operational amplifier coupled to the measurement electrode and the shielding electrode, and a bypass resistor between the measurement electrode and ground. In some instances, the measurement electrode, the shielding electrode, and the dielectric substrate may comprise a thin semi-cylindrical form factor. The measurement electrode may be positioned immediately adjacent the conductor passage of the conductor to be sensed.

In some embodiments, the detector system may be configured for contactless voltage sensing with or without current sensing functionality. For example, one embodiment of a detector system for voltage sensing may be summarized as including: a frame having conductor receiving locations configured to receive a plurality of current carrying conductors and to support the conductors in a fixed arrangement relative to the frame; a respective voltage sensing arrangement for each of at least two of the conductors, each voltage sensing arrangement including a capacitive sensing electrode with an active shield provided at a first location along a length of a conductor passage for the conductor, and a capacitive calibration electrode with an active shield provided at a second location offset from the first location along the length of the conductor passage for the conductor; and a computing system communicatively coupled to the voltage sensing arrangement of each conductor and being configured to receive calibration data from each voltage sensing arrangement and to generate an estimated capacitance value of the capacitive sensing electrode of the voltage sensing arrangement based in part on said calibration data. The computing system may be further configured to generate an estimated voltage differential between the two conductors based in part on the estimated capacitance values of the capacitive sensing electrodes.

In some embodiments, the detector system may be configured for contactless voltage sensing with or without the aforementioned capacitive calibration electrode. For example, one embodiment of a detector system for voltage sensing may be summarized as including: a frame having conductor receiving locations configured to receive a plurality of current carrying conductors and to support the conductors in a fixed arrangement relative to the frame; a respective voltage sensing arrangement for each of at least two of the conductors, each voltage sensing arrangement including a capacitive sensing electrode having a measurement electrode, a shielding electrode, a dielectric substrate between the measurement electrode and the shielding electrode to isolate the measurement electrode from the shielding electrode, an operational amplifier coupled to the measurement electrode and the shielding electrode, and a bypass resistor between the measurement electrode and ground; and a computing system communicatively coupled to the voltage sensing arrangement of each conductor and being configured to receive measurement data from each voltage sensing arrangement and to generate an estimated voltage differential between the two conductors based on said measurement data.

Various related methods may also be provided. For example, a method of calibrating a voltage sensing apparatus according to one example embodiment may be summarized as including: providing a capacitive calibration electrode and a capacitive sensing electrode at offset locations along a length of a conductor of an energized system to be monitored; applying a calibration signal of known magnitude and frequency to the capacitive calibration electrode to capacitively induce a calibration voltage in the conductor and in turn capacitively induce an electrode voltage in the capacitive sensing electrode; sensing the electrode voltage; and based on the sensing of the electrode voltage, calculating a capacitance value of the capacitive sensing electrode. Calculating the capacitance value of the capacitive sensing electrode may include calculating the capacitance value based on a lumped parameter model that estimates additional parasitic capacitances of the voltage sensing apparatus. Calculating the capacitance value of the capacitive sensing electrode may include calculating the capacitance value based on a lumped parameter model that accounts for electrical circuit non-linear dynamics. The method may further include storing the capacitance value for subsequent use in calculating voltage in the conductor of the energized system to be monitored.

As another example, a method of estimating current in a plurality of current carrying conductors of an energized system may be summarized as including: obtaining magnetic field data from a redundant array of magnetic field sensors of a detector unit that is secured to the conductors within an environment subjected to external magnetic field disturbances, the detector unit supporting the magnetic field sensors in a fixed relationship to the conductors without electromagnetic shielding; and generating an estimated current by utilizing an estimator algorithm that accounts for said external magnetic field disturbances on the magnetic field in the vicinity of the conductors to enhance the accuracy of the estimated current.

As yet another example, a method of estimating voltage in a plurality of current carrying conductors of an energized system which are subjected to external magnetic field disturbances in the vicinity of the conductors may be summarized as including: obtaining voltage data via a respective voltage sensing arrangement provided in a detector unit for each of the conductors, each voltage sensing arrangement including a capacitive sensing electrode having a measurement electrode, a shielding electrode, a dielectric substrate between the measurement electrode and the shielding electrode to isolate the measurement electrode from the shielding electrode, an operational amplifier coupled to the measurement electrode and the shielding electrode, and a bypass resistor between the measurement electrode and ground; and calculating a voltage differential between two of the conductors based on said voltage data.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

Various aspects described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure.

For example, aspects and features of the various embodiments described herein can be combined to provide further embodiments. Furthermore, all of the U.S. patents, U.S. patent application publications, U.S. patent applications, foreign patents, foreign patent applications and non-patent publications referred to in this specification are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A detector system for contactless current sensing, the detector system comprising:
    a frame having conductor receiving locations configured to receive a plurality of current carrying conductors and to support the conductors in a fixed arrangement relative to the frame;
    a plurality of magnetic field sensors supported by the frame in a redundant array in a fixed relationship with respect to the conductor receiving locations to sense a magnetic field in a vicinity of the conductors during operation; and
    a computing system communicatively coupled to the magnetic field sensors, the computing system configured to receive magnetic field data from the redundant array of magnetic field sensors and to generate an estimated current by utilizing an estimator algorithm that accounts for external magnetic field disturbances on the magnetic field in the vicinity of the conductors to enhance the accuracy of the contactless current sensing of the detector system.

2. The detector system of claim 1, wherein each magnetic field sensor is configured to output a voltage linearly proportional to a component of a magnetic field along an axis of sensitivity of the magnetic field sensor.

3. The detector system of claim 2, wherein the axis of sensitivity of each magnetic field sensor is fixed in an orthogonal direction relative to a direction of current flow through the conductors.

4. The detector system of claim 2, wherein the axis of sensitivity of at least one of the magnetic field sensors is perpendicular to the axis of sensitivity of at least one other one of the magnetic field sensors.

5. The detector system of claim 1, wherein the redundant array of magnetic field sensors includes a plurality of overlapping subsets of the magnetic field sensors, each overlapping subset encircling a respective one of the conductors.

6. The detector system of claim 1, wherein the magnetic field sensors are arranged in a plane transverse to a direction of current flow through the conductors.

7. The detector system of claim 1, wherein at least some of the magnetic field sensors are arranged between the conductor receiving locations.

8. The detector system of claim 1, wherein a number of the magnetic field sensors is at least three times a number of the current carrying conductors to be sensed.

9. The detector system of claim 1, wherein the detector system is devoid of electromagnetic shielding around the redundant array of magnetic field sensors.

10. The detector system of claim 1, wherein the estimator algorithm comprises one of the following:
    an Ordinary Least Squares estimator technique;
    an Ampere's Law estimator technique;
    a Non-linear Model estimator technique;
    a Linear Model estimator technique;
    a Spatial Harmonics estimator technique;
    a Best Linear Unbiased estimator technique;
    a Machine Learning estimator technique; and
    a Regression estimator technique.

11. The detector system of claim 1, wherein the estimator algorithm is based on a Best Linear Unbiased estimator technique.

12. The detector system of claim 1, wherein the computing system is configured to generate the estimated current without employing frequency filtering of a frequency of an energized system to which the conductors belong.

13. The detector system of claim 1, wherein the frame is configured to be removably secured to the conductors without disconnecting the conductors from an energized system to which the conductors belong.

14. The detector system of claim 1, wherein the detector system is further configured for contactless voltage sensing and further comprises, for each of at least two of the conductors, a voltage sensing arrangement comprising:
    a capacitive sensing electrode with an active shield provided at a first location along a length of a conductor passage for the conductor; and a capacitive calibration electrode with an active shield provided at a second location offset from the first location along the length of the conductor passage for the conductor, and wherein the computing system is communicatively coupled to the voltage sensing arrangement and configured to receive calibration data from the voltage sensing arrangement and to generate an estimated capacitance value of the capacitive sensing electrode based in part on said calibration data.

15. The detector system of claim 14, wherein the computing system is further configured to generate an estimated voltage differential between the two conductors based in part on the estimated capacitance values of the capacitive sensing electrodes.

16. The detector system of claim 14, wherein the capacitive sensing electrode includes a measurement electrode, a shielding electrode, a dielectric substrate between the measurement electrode and the shielding electrode to isolate the measurement electrode from the shielding electrode, an operational amplifier coupled to the measurement electrode and the shielding electrode, and a bypass resistor between the measurement electrode and ground.

17. A method of estimating current in a plurality of current carrying conductors of an energized system, the method comprising:

obtaining magnetic field data from a redundant array of magnetic field sensors of a detector unit that is secured to the conductors within an environment subjected to external magnetic field disturbances, the detector unit supporting the magnetic field sensors in a fixed relationship to the conductors without electromagnetic shielding; and generating an estimated current by utilizing an estimator algorithm that accounts for said external magnetic field disturbances on the magnetic field in the vicinity of the conductors to enhance the accuracy of the estimated current.

18. The method of claim 17 wherein the estimator algorithm comprises one of the following:
an Ordinary Least Squares estimator technique;
an Ampere's Law estimator technique;
a Non-linear Model estimator technique;
a Linear Model estimator technique;
a Spatial Harmonics estimator technique;
a Best Linear Unbiased estimator technique;
a Machine Learning estimator technique; and
a Regression estimator technique.

19. The method of claim 17 wherein the estimator algorithm is based on a Best Linear Unbiased estimator technique.

20. The method of claim 17, further comprising:
obtaining voltage data via a respective voltage sensing arrangement provided in the detector unit for each of the conductors, each voltage sensing arrangement including a capacitive sensing electrode having a measurement electrode, a shielding electrode, a dielectric substrate between the measurement electrode and the shielding electrode to isolate the measurement electrode from the shielding electrode, an operational amplifier coupled to the measurement electrode and the shielding electrode, and a bypass resistor between the measurement electrode and ground; and
calculating a voltage differential between two of the conductors based on said voltage data.

* * * * *